United States Patent [19]

Bodenhausen et al.

[11] Patent Number: 5,327,086
[45] Date of Patent: Jul. 5, 1994

[54] MULTIPLE-QUANTUM NMR WITH FREQUENCY-MODULATED CHIRP PULSES

[75] Inventors: Geoffrey Bodenhausen, Pully; Jean-Marc Böhlen, Lausanne; Irene Burghardt, Reneus, all of Switzerland

[73] Assignee: Spectrospin AG, Faellanden, Switzerland

[21] Appl. No.: 956,885
[22] PCT Filed: Jul. 11, 1990
[86] PCT No.: PCT/EP90/01131
 § 371 Date: Dec. 11, 1992
 § 102(e) Date: Dec. 11, 1992
[87] PCT Pub. No.: WO92/01235
 PCT Pub. Date: Jan. 23, 1992
[51] Int. Cl.[5] .............................................. G01V 3/00
[52] U.S. Cl. .................................... 324/307; 324/309
[58] Field of Search ............... 324/300, 307, 309, 310, 324/314

[56] References Cited

U.S. PATENT DOCUMENTS

| | | | |
|---|---|---|---|
| 3,725,773 | 4/1973 | Nelson | 324/309 |
| 4,238,735 | 12/1980 | Muller | 324/310 |
| 4,703,270 | 10/1987 | Hall et al. | 324/310 |
| 5,045,790 | 9/1991 | Hall et al. | 324/307 |
| 5,166,616 | 11/1992 | Doddrell et al. | 324/300 |
| 5,168,229 | 12/1992 | Hurd et al. | 324/307 |

OTHER PUBLICATIONS

Journal of Magnetic Resonance, vol. 64, 1985, Academic Press, Inc., (Duluth, MN, U.S.), Dumoulin: "The Application of Multiple-Quantum Techniques for the Suppression of Water Signals in $^1$H NMR Spectra", pp. 38-46.
Journal of Magnetic Resonance, vol. 83, No. 1, Jun. 1989, Academic Press, Inc., (Duluth, MN, U.S.), Yeung et al.: "Imaging and Localized Spectroscopy of $^{13}$C by Polarization Transfer", pp. 183-189.
J. S. Waugh (ed.), "Advances in Magnetic Resonance", vol. 11, 1983, Academic Press, (New York, U.S.).
D. P. Weitekamp: "Time-Domain Multiple-Quantum NMR", pp. 111-274.
Journal of Magnetic Resonance, vol. 84, No. 1, Aug. 1989, Academic Press, Inc., (Duluth, MN, U.S.), Böhlen et al.: "Refocusing with Chirped Pulses for Broadband Excitation Without Phase Dispersion", pp. 191-197.
Molecular Physics, vol. 50, No. 5, 1983, Levitt et al.: "Improvement of Pulse Performance in N.M.R. Coherence Transfer Experiments. A Compensated Inadequate Experiment", pp. 1109-1124.
Journal of Magnetic Resonance, vol. 87, No. 1, Mar. 1990, Academic Press, Inc., (Duluth, MN, U.S.), Wimperis: "Correlation of Connected Double-Quantum and Single-Quantum Transitions. Two-Dimensional Double-Quantum Spectroscopy . . . " pp. 174-182.

*Primary Examiner*—Louis Arana
*Attorney, Agent, or Firm*—Flynn, Thiel, Boutell & Tanis

[57] ABSTRACT

Frequency-modulated "chirp" pulses for exciting multiple-quantum coherences over large bandwidths can be considered as an alternative to composite pulses to combat the effects of large offsets and tilted effective fields. Refocusing of the phase dispersion of double-quantum coherence can be combined with suitable detection sequences to yield pure absorption two-dimensional double-quantum spectra. The method of symmetrical excitation and detection by time-reversal may be applied to obtain $t_1$-modulated longitudinal magnetization, which may then be converted into observable single-quantum coherence by a chirp echo sequence. Similar approaches can be used for many other NMR experiments involving coherence transfer.

24 Claims, 15 Drawing Sheets

MULTIPLE-QUANTUM NMR WITH FREQUENCY-MODULATED CHIRP PULSES

The invention relates to a method for exciting multiple-, especially double-quantum coherence in NMR pulse experiments by irradiating a nuclear spin system, subjected to a magnetic field with a first sequence of RF-pulses comprising a basic sandwich consisting of a first $\pi/2$-pulse, a first $\pi$-pulse being generated after elapse of a defocusing time interval $\tau$ following the first $\pi/2$-pulse and a second $\pi/2$-pulse being generated after elapse of another time interval $\tau$ following the first $\pi$-pulse and for reconverting said excited multiple-quantum coherence into transverse magnetization inducing a free induction decay by irradiating said nuclear spin system with a second sequence of RF-pulses.

A method of the above mentioned kind is known from the scientific publication by D. P. Weitekamp, Adv. Magn. Reson. 11,111 (1983).

Many modern NMR methods make use of the phenomenon of coherence transfer, where transverse magnetization, or more generally p-quantum coherence, is transferred from one spin (or set of spins) to another. Some of the best known examples are correlation spectroscopy and multiple-quantum NMR. Many of these experiments rely on the extensive use of so-called "hard" pulses to induce rotations of the density operator. In practice, such pulses are often not really hard enough to be truly offset-independent, so that off-resonance effects (tilted effective fields) have to be taken into consideration. In the simplest experiments, such as in correlation spectroscopy (COSY), off-resonance effects merely lead to relatively innocuous phase errors which can easily be corrected by suitable data processing.

In more sophisticated experiments however, errors in successive pulses often have a cumulative effect which may lead to a complete failure of the desired coherence transfer processes. Thus in multiple-quantum NMR according to the above citation, the coherences are excited by a sandwich of three monochromatic radio-frequency pulses $(\pi/2 - \tau - \pi - \pi/2)$. If the effective fields are tilted, this sandwich may fail completely. This point has been discussed in detail by Levitt and Ernst, Mol. Phys. 50, 1109 (1983), who proposed alternative sequences incorporating composite pulses. These sequences are based on the idea that several successive rotations can be designed so as to have a better overall behaviour than a single rotation. A limitation of composite pulses is that they only perform well over a limited frequency window, typically over a range of offsets comparable to the RF amplitude.

In the following, a pulse which converts the magnetization from an initial state aligned with the magnetic field to a new state, where the magnetization is orthogonal to the magnetic field, will be designated as "$\pi/2$-pulse", whereas a pulse which converts the transverse magnetization into transverse magnetization in such a manner that a spin-echo is formed, will be designated as "$\pi$-pulse".

Like Levitt and Ernst, we shall focus attention on double-quantum spectroscopy of pairs of weakly-coupled spin $\frac{1}{2}$ nuclei. From the point of view of spectroscopic recognition of molecular structure, one of the potentially most promising experiments of this type is the carbon-carbon correlation experiment known under the name INADEQUATE from A. Bax et al. in J. Am. Chem. Soc. 102,4849 (1980). This method allows one to identify the entire carbon backbone of organic molecules by mere inspection of the signals in a two-dimensional spectrum. This approach would undoubtedly enjoy much greater popularity if it were not for difficulties in obtaining reliable excitation of double-quantum coherences over arbitrary spectral widths.

It is, therefore, a primary object of the invention to provide a method of the initially mentioned kind for exciting multiple-quantum coherences efficiently over wide offset ranges using RF-pulses of comparatively small amplitudes.

SUMMARY OF THE INVENTION

This object, according to one aspect of the invention, is achieved by a method, where the three RF-pulses of said basic sandwich are chirp pulses having each a duration $t_p$ during which the frequency of the exciting RF-field is swept in a monotonous relation with respect to time from a lower limit frequency $\omega_{RFmin}$ to an upper limit frequence $\omega_{RFmax}$ or vice versa and said basic sandwich is followed by a fourth chirp pulse with a duration $t_{p/2}$ and an amplitude of between 2 and 4 times the amplitude of said first $\pi/2$ pulse.

In "Journal of Magnetic Resonance"; Vol. 84, No. 1, August 1989, pages 191–197 the co-inventors of the present invention, G. Bodenhausen and J.-M. Böhlen have published an article together with M. Rey with the title: "Refocussing with Chirped Pulses for Broadband Excitation without Phase Dispersion". This publication describes a method for the excitation and observation of single-quantum coherences by use of chirp pulses. However, in this paper no methods for exciting double-quantum or multiple-quantum coherences are discussed nor does the publication disclose anything like correlation of pairs of nuclei, but only the excitation and observation of the magnetization of one nuclear species.

Multiple-quantum coherence is generated by the action of the three RF-pulses of the basic sandwich on the spin system, while the following fourth chirp pulse is refocusing the phase of the multiple-quantum coherence such that the phase is nearly offset-independent over large bandwidths. The sequence of chirp pulses can be considered as an alternative to composite pulses to combat the effects of large offsets and tilted effective fields. By the chirp pulse sequence according to the invention the condition of a refocusing of the magnetization vectors is fulfilled, i.e., phase-distortions otherwise to be taken into account may be kept negligible over a very large bandwidth, the invention, therefore, combining the advantages of pulse spectroscopy techniques with those of CW spectroscopy. Moreover, using chirp pulses instead of monochromatic hard pulses considerably reduces the pulse amplitudes necessary for the excitation of multiple-quantum coherence, which is especially of great advantage in the field of in-vivo applications of the method according to the invention, e.g. in NMR-imaging or NMR-in-vivo-spectroscopy.

In a preferred mode of the method according to the invention the basic sandwich of three RF-pulses is immediately followed by the fourth refocusing chirp pulse, thus minimizing the relaxation time which implies smaller loss of multiple-quantum coherence due to relaxation and hence increased sensitivity of the method.

The method according to the invention not being very sensitive to the amplitude of the first chirp $\pi$-pulse, most practical cases are covered by choosing the amplitude of the first $\pi$-pulse between 2 and 4, preferably about 2.8 times the amplitude of the first $\pi/2$-pulse. The amplitude of the second $\pi/2$-pulse in the basic sandwich should be about the same as the amplitude of the first $\pi/2$-pulse and the amplitude of the fourth chirp pulse should be chosen about 3.3 times the amplitude of the first $\pi/2$-pulse in the basic sandwich.

Another object of the invention is the recovering of observable single-quantum coherences (e.g. of spins A and M in a two-spin system) out of non-observable multiple-quantum coherence. This can be achieved, according to another aspect of the invention, when the second sequence of RF-pulses is started after a dephasing time interval $\tau_1$ following the $\omega_{RFmin}$ multiple-quantum-echo generated by the first sequence of RF-pulses and the second sequence of RF-pulses comprises a chirp refocusing $\pi$-pulse having a duration $t_p/2$ during which the frequency of the RF-field is swept in a monotonous relation with respect to time from a lower limit frequency $\omega_{RFmin}$ to an upper limit frequency $\omega_{RFmax}$ and a subsequent chirp $\pi/2$-pulse of duration $t_p$.

In a preferred mode of the method according to the invention the second sequence of RF-pulses further comprises another chirp $\pi$-pulse of duration $\tau_\pi = t_p/2$ being applied after a time delay $\tau_2$ following the chirp $\pi/2$-pulse and the resulting spin-echo is detected after a final delay $\tau_3$ following the other chirp $\pi$-pulse. This allows for recovering of pure phase spectra, i.e. pure absorption or pure dispersion, in the $\omega_2$ dimension.

In case of exciting double-quantum coherence between spin A and spin M, the time delay $\tau_2$ can be chosen such that $\tau_2 \approx 0$ and the final delay $\tau_3$ such that $\tau_3 \approx \tau_\pi$. This leads to doublets with anti-phase structure in two-dimensional spectra. If the time delay $\tau_2$ is chosen such that $\tau_2 \approx (2J_{AM})^{-1}$ and the final delay $\tau_3$ such that $\tau_2 + \tau_\pi + \tau_3 \approx J_{AM}^{-1}$, where $J_{AM}$ designates the scalar coupling constant for the coupling between spin A and spin M, the signal amplitude as a function of the offsets becomes smoother, i.e. the unwanted frequency dependence of the signal becomes smaller.

In order to obtain doublets with in-phase structure in two-dimensional spectra, the time delay $\tau_2$ is to be chosen such that $\tau_2 \approx (4J_{AM})^{-1}$ and the final delay $\tau_3$ such that $\tau_2 + \tau_\pi + \tau_3 \approx (2J_{AM})^{-1}$.

Recovering of observable single-quantum coherences out of multiple-quantum coherence can also be achieved by another mode of the method according to the invention, where the three RF-pulses of the basic sandwich are chirp pulses having each a duration $t_p$ during which the frequency of the exciting RF-field is swept in a monotonous relation with respect to time from a lower limit frequency $\omega_{RFmin}$ to an upper limit frequency $\omega_{RFmax}$ or vice versa and where, after an evolution interval $t_1$, the basic sandwich is followed by its exact time reversed sandwich, i.e. three chirp pulses of $\pi/2$, $\pi$ and again $\pi/2$-kind, having each a duration $t_p$, being spaced from each other by a time interval $\tau$ respectively and being swept from an upper limit frequency $\omega_{RFmax}$ to a lower limit frequency $\omega_{RFmin}$ or vice versa.

The final conversion of $I_z$ generated by the propagator V into observable single-quantum coherence may be achieved by an echo sequence composed of a chirp $\pi/2$ pulse followed by a chirp $\pi$ pulse having half the duration and between 2 and 4 times, preferably 2.8 times the amplitude of the preceding chirp $\pi/2$ pulse.

Again, the amplitude of the first $\pi$-pulse in the basic sandwich should be chosen to be between 2 and 4, preferably about 2.8 times the amplitude of the first $\pi/2$-pulse and the amplitude of the second $\pi/2$-pulse in the basic sandwich should be about the same as the amplitude of the first $\pi/2$ pulse.

Choice of a very short evolution time interval $t_1 \approx 0$ leads to 1-dimensional "INADEQUATE"-Spectra.

In order to refocus the double-quantum coherence (DQC) and the zero-quantum coherence (ZQC) excited by the basic sandwich, either at the beginning or at the end of a finite evolution time interval $t_1$ a hard refocusing $\pi$-pulse can be applied.

Refocusing of multiple-quantum coherence can also be achieved, when during the evolution time interval $t_1$ the basic sandwich is followed by a fourth chirp pulse with a duration $t_p/2$ and an amplitude of between 2 and 4 times the amplitude of the first $\pi/2$-pulse in the basic sandwich. In most practical cases the timing of the pulses is chosen such that the basic sandwich is immediately followed by the fourth chirp pulse and its amplitude is chosen about 3.3 times the amplitude of the first $\pi/2$-pulse in the basic sandwich.

In a preferred mode of the method according to the invention the second sequence of RF-pulses for reconverting multiple-quantum coherence into observable single-quantum coherence is composed of a chirp $\pi/2$-pulse followed by a chirp $\pi$-pulse having half the duration and between 2 and 4 times, preferably about 2.8 times, the amplitude of the preceding chirp $\pi/2$-pulse.

Acquisition of free induction decay signal following the second sequence of RF-pulses may be started immediately at the trailing edge of this pulse sequence or, as it is preferable in some cases, at maximum intensity of the spin-echo signal in which case a spectrum obtained by Fourier transformation of the echo signal is essentially free of phase-dispersion.

In usual cases, the frequency sweep of the RF exciting radiation is linear with respect to time being performed at a constant sweep rate b. In special cases it might be helpful, however, to provide for a non-linear but monotonous frequency sweep between the limiting frequencies $\omega_{RFmin}$ and $\omega_{RFmax}$.

The invention being useful for a variety of NMR pulse spectroscopy applications such as two-dimensional exchange spectroscopy, homo- and heteronuclear correlation spectroscopy, it is understood that NMR pulse spectrometers having the said spectroscopic capabilities and being equipped with an installation enabling an operation mode in accordance with the invention are also regarded as subject matter of the invention.

Further details, aspects and advantages of the invention will be apparent from the following description of the invention with reference to the drawing wherein

DESCRIPTION OF THE PREFERRED EMBODIMENT

Figure 1:
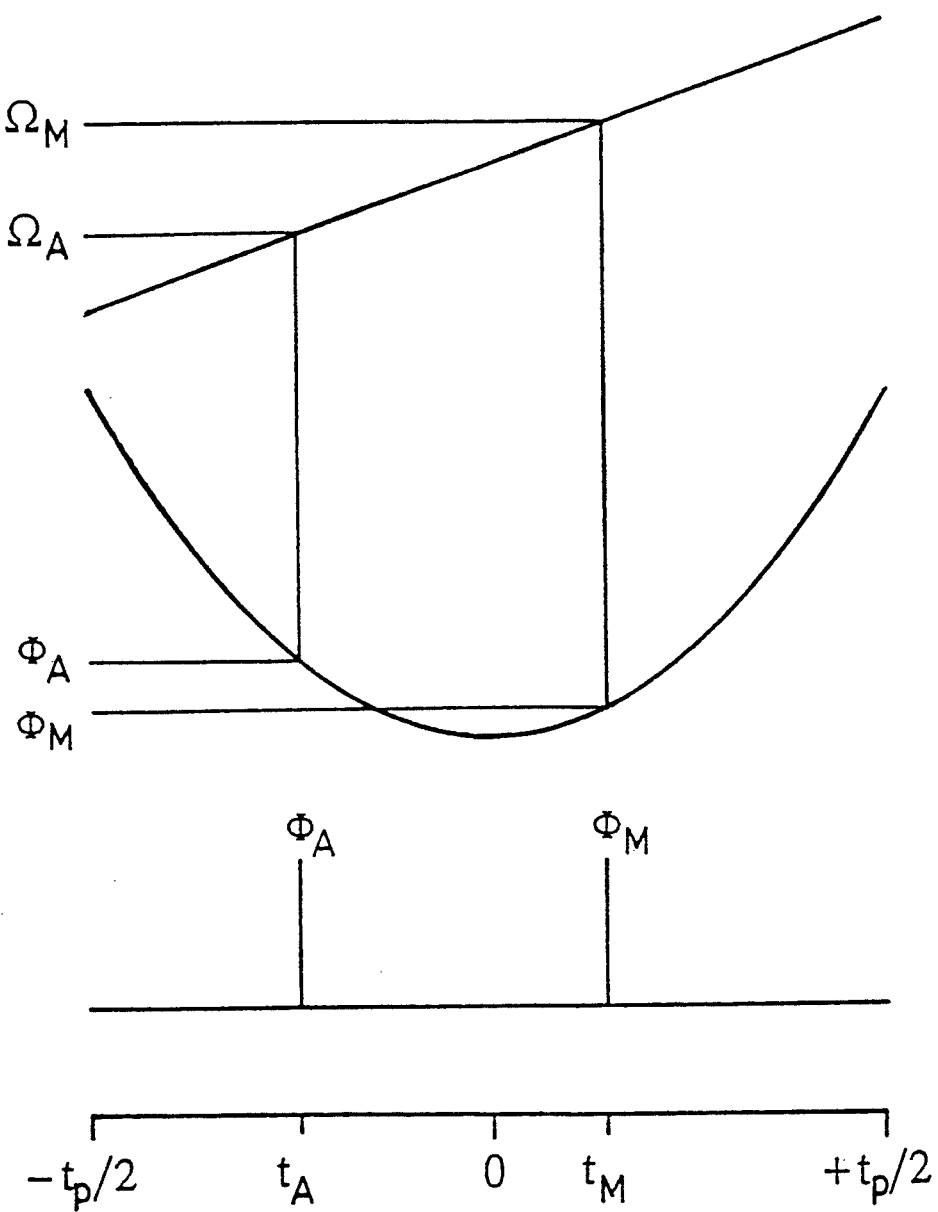
FIG. 1 the time-dependence of the RF-frequency (top), the instantaneous RF-phases (middle) and schematic nuclear magnetic resonance spectrum (below)

Consider a scalar-coupled two-spin system subject to a frequency-modulated pulse. We express the time-dependent Hamiltonian in a rotating frame that is synchronized with the instantaneous frequency of the transmitter:

$$H(t) = H_0(t) + H_{RF} \quad (1)$$
$$= \Omega_A(t) I_z^A + \Omega_M(t) I_z^M + 2\pi J I^A \cdot I^M +$$
$$\gamma B_1[(I_x^A + I_x^M)\cos \phi + (I_y^A + I_y^M)\sin \phi],$$

where $\Omega_A(t) = \omega_0^A - \omega_{RF}(t)$ is the offset of spin A with respect to the time-dependent transmitter frequency. In this frame, the RF phase $\phi$ is time-independent, but it can be shifted from one pulse to the next in order to select coherence transfer pathways by phase-cycling. We consider the RF amplitude $\gamma B_1$ to be constant during the frequency sweep. If we assume that the Hamiltonian is time-independent over short time intervals $\tau$, we can integrate the Liouville-von Neumann equation.

$$d\sigma(t)/dt = -i[H(t), \sigma(t)] \quad (2)$$

over an interval $[t', t', +\tau]$ and obtain $$\sigma(t'+\tau) = \exp\{-iH(t')\tau\}\sigma(t')\exp\{iH(t')\tau\} \quad (3)$$

The time evolution of the density operator $\sigma$ can thus be calculated by stepwise transformations under the effect of the instantaneous Hamiltonian $H(t')$. As $H(t')$ contains non-commuting contributions from RF irradiation, chemical shifts and scalar coupling, the steps must be calculated by numerical diagonalization. Alternatively, the unitary transformation of Eq. (3) may be decomposed into consecutive rotations due to the different parts of the Hamiltonian, since $$\exp\{-iO\tau\}\exp\{-iH_{RF}\tau\} = \quad (4a)$$
$$\exp\{-i(H_0 + H_{RF})\tau\} [1 - 1/2[H_0,H_{RF}]\tau^2 +$$

terms in higher orders of $\tau$].

For small $\tau$ values the terms involving quadratic and higher orders of $\tau$ may be neglected:

$$\exp\{-i(H_O+H_{RF})\tau\} \approx \exp\{-iH_O\tau\}\exp\{-iH_{RF}\tau\} \quad (4b)$$

Thus, for each interval $\tau$ we may calculate the effects of $H_O$ and $H_{RF}$ consecutively. Furthermore we may introduce the assumption of weak coupling, so that the scalar coupling term in Eq. (1) is reduced to $2\pi J I_z^A I_z^M$. This allows us to expand the density operator in products of angular momentum operators. We have performed simulations based on both the product operator formalism and on explicit matrix representations of the density operator. Typically about 2000 intervals are necessary to describe the effect of a pulse covering a 20 kHz sweep range in 16 ms.

As an alternative to the accelerating rotating frame used in Eq. (1), we may also consider the usual frame rotating at a constant reference frequency $\omega_{ref}$. In this frame, a linear frequency sweep implies that the RF transmitter phase varies quadratically as a function of time, since $\phi_{RF}(t) = \int \omega_{RF}(t) dt$. In this frame, we can shift the initial phase $\phi_{RF}(0)$ of the transmitter at the beginning of the sweep in order to select coherence transfer pathways.

The conventional rotation frame is the natural reference frame for an approximate description of chirp pulses, which helps to guide intuition. This description assumes that a spin is affected by the RF field only when it passes exactly through resonance. As a result, we have in effect instantaneous semiselective pulses separated by pure evolution intervals. For simplicity, we shall refer to this picture as "pulse/evolution model". Note that the J coupling is always very small compared to the RF amplitude $\gamma B_1$ so that we may always assume that both components of a doublet are affected simultaneously, hence the use of the expression "semiselective pulse". This must be distinguished from the approach advocated by Ferretti and Ernst, who in their description of rapid passage used a cascade of truly selective pulses affecting one transition at a time.

FIG. 1 shows the relationship between frequency and phase. For a linear frequency sweep, the phase $\phi_A$ of the semiselective pulse acting on spin A is related quadratically to the instant $t_A$ of passage through resonance $\phi_A = \frac{1}{2}bt_A^2$, or, equivalently, to the offset $\phi_A = \frac{1}{2}\Omega_A^2/b$, as shown in FIG. 1. The sweep rate b is the ratio of the sweep range and the duration of the pulse, $b = \Delta\omega_p/t_p$, expressed in rad s$^{-2}$.

During a chirp pulse with a linear frequency sweep, the resonances of spins A and M are crossed at time $t_A$ and $t_M$, when the RF frequency (top) coincides with the chemical shifts $\Omega_A$ and $\Omega_M$, and when the instantaneous RF phases (middle) are and $\phi_A$ and $\phi_M$ In systems containing isolated spins I=$\frac{1}{2}$, the pulse/evolution model is entirely adequate to predict the formation of echoes by a sequence of two chirp pulses. In coupled spin systems however, this model only provides a qualitative view. In the following we shall compare analytical results obtained from the pulse/evolution description with rigorous simulations obtained either by stepwise diagonalization of the Hamiltonian or by operator product transformations.

Figure 2A:
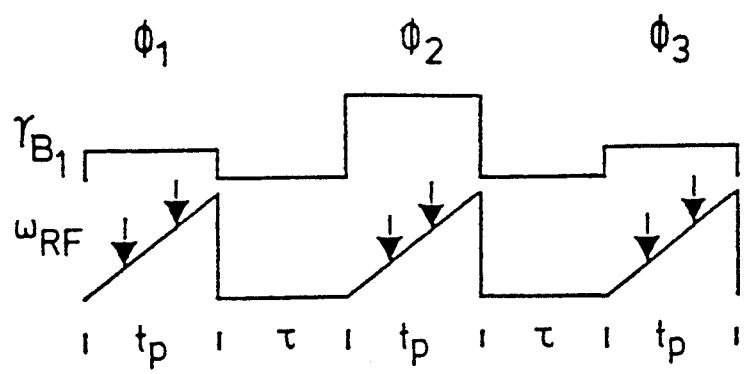
FIG. 2 the time-dependence of
a) the RF-amplitude $\gamma B_1$ and RF frequency $\omega_{RF}$ for the basic sandwich of three chirp pulses designed for broadband multiple-quantum excitation,
b) the magnitudes of the antiphase term $|2I^A_z I^M_{xy}|$, and
c) the magnitudes of the double-quantum term $|DQC|$.

The basic sandwich consisting of three chirp pulses of FIG. 2a is built on the same principles as the $(\pi/2 - \tau - \pi - \tau - \pi/2)$ sandwich commonly used for the generation of multiple quantum coherences. All three chirp pulses must have the same duration, and hence the same sweep rate. Their amplitudes must be adjusted to achieve either the analogue of a $\pi/2$ pulse or of a $\pi$ pulse. A chirp $\pi/2$ pulse is characterized by a relatively weak RF amplitude, so that the adiabatic condition is deliberately violated, in such a manner that the magnetization fails to remain locked along to the effective field throughout the sweep. A chirp $\pi$ pulse on the other hand has sufficient RF amplitude to allow either adiabatic inversion or, as in this case, refocusing of transverse magnetization. In adiabatic inversion, the magnetization remains locked along the effective field, while for refocusing the magnetization remains perpendicular to the effective field during the sweep. In FIG. 2a the first chirp $\pi/2$ pulse generates transverse magnetization starting from thermal equilibrium, the second pulse refocuses the effect of offsets (chemical shifts) but not those of homonuclear scalar couplings, and the third pulse converts antiphase single-quantum magnetization into multiple-quantum coherence. The relative phases have to be optimized for maximum creation of double-or zero-quantum coherence. Like in the conventional sandwich, the spacing between the beginning of the first and third pulses must be on the order of $(2J_{AM})^{-1}$.

Figure 2B:
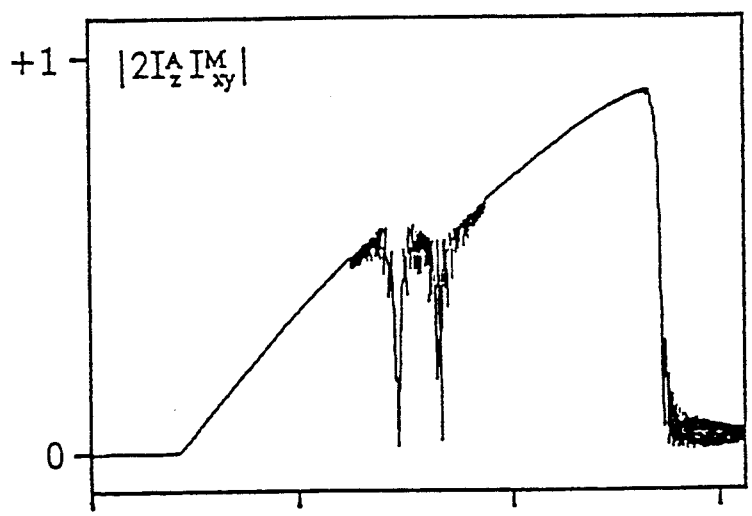
Figure 2C:
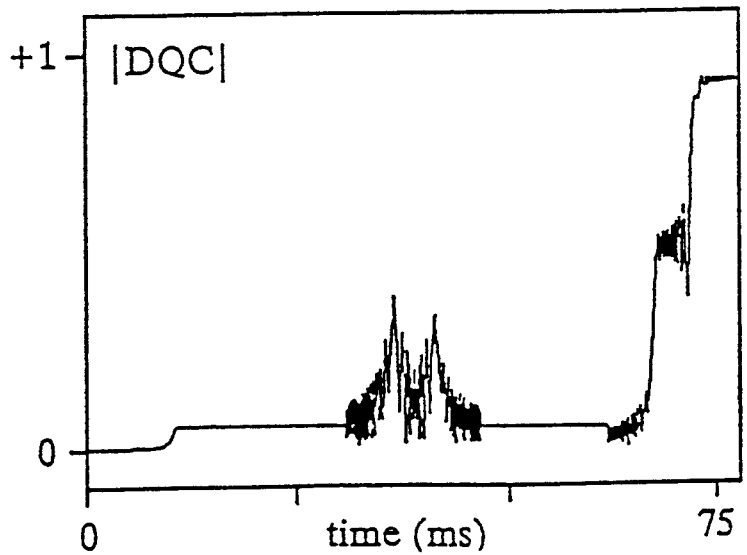

FIGS. 2b and c show the time dependence of an antiphase single-quantum term and of the double-quantum coherence in a two-spin system. The phase behaviour is rather complicated since it refers to the accelerating rotating frame, so we prefer to show the evolution of the magnitudes $|2I^A_z I^M_{xy}|$ and $|DQC|$ (see definitions in Table 1). The antiphase term builds up spontaneously under the effect of the scalar coupling, with an envelope roughly proportional to sin $(\pi J_{AM}t)$. In the course of the third pulse of the sandwich, the antiphase term is partly converted into double-quantum coherence. FIG. 2 shoes how the $|DQC|$ term builds up in two successive steps, due to contributions first from $|2I^A_z I^M_{xy}|$, then from $|2I^A_{xy} I^M_z|$. Whether or not we obtain constructive interference of these two contributions is determined by the relative phases of the three pulses. It can be shown that a shift of the phase $\phi_2$ of the second pulse merely induces a trival phase-shift of $2\phi_2$ of the single-quantum coherences in the refocusing interval after the second pulse, so that it is sufficient to consider the effect of the phase $\phi_3$ of the third pulse of the sandwich.

The RF frequency coincides with the chemical shifts $\Omega_A/2\pi = 7$ kHZ and $\Omega_M/2\pi = 13$ kHZ at the times indicated by arrows. Parameters of the simulations: $J_{AM} = 8$ Hz, $t_p = 16$ ms, $\tau = 15$ ms (so that $2t_p + 2\tau = \frac{1}{2} J_{AM}$), sweep range 20 kHZ, $\gamma B_1 = 309,860$ and 309 Hz for the three successive pulses with effective flip angles $\pi/2$, $\pi$ and $\pi/2$, respectively. The initial phases of the three pulses were $\phi_1 = \phi_2 = 0$ and $\phi_3 = 120°$, the latter being chosen for optimum excitation. Note the build-up of the double-quantum term in two successive stages to nearly maximum amplitude.

FIG. 3 shows that the optimum value for double quantum excitation corresponds to a phase of $\phi_3 \approx 120°$ ($\pm 180°$), given the choice of RF amplitudes for the three pulses indicated above. In fact, the phase requirements and the amplitudes of the $\pi$ and $\pi/2$ pulses are interdependent. A variety of conditions can be found for efficient excitation of multiple quantum coherences.

Figure 3A:
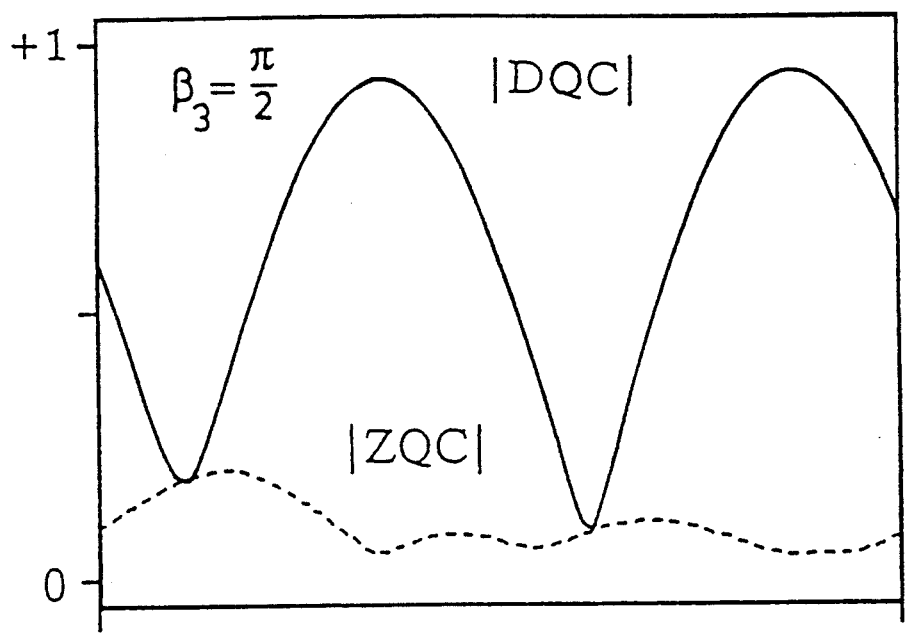
FIG. 3 the magnitudes of double-quantum coherence (solid lines) and zero-quantum coherence (dashed lines) excited by the basic sandwich of FIG. 2 as a function of the initial phase $\phi_3$ of the third pulse in the basic sandwich, where
  a) all parameters are like FIG. 2
  b) the effective flip angle $\beta_3$ of the third pulse has been decreased to $\pi/4$.
Figure 3B:
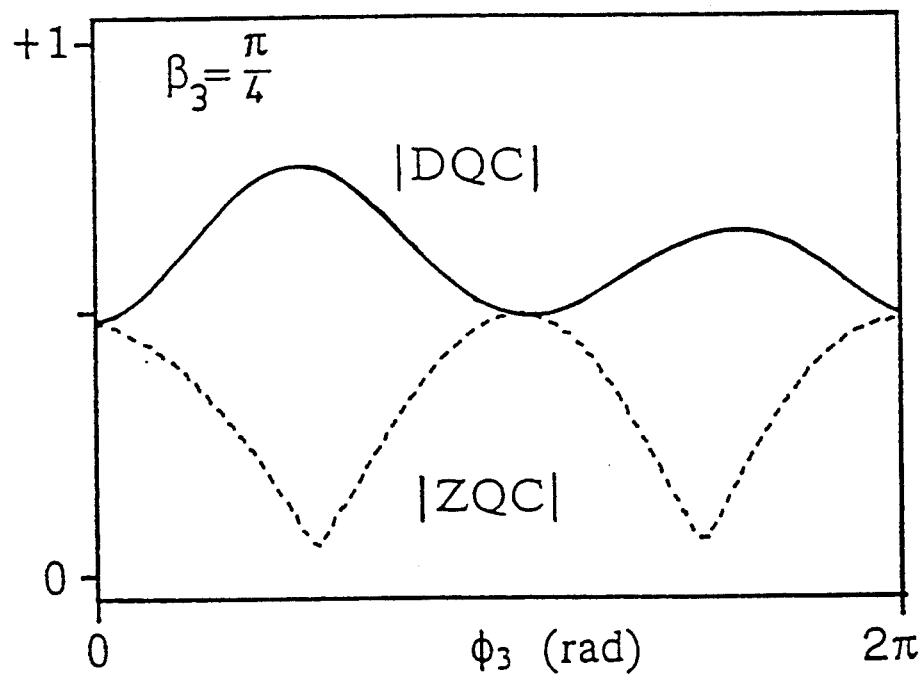

In FIG. 3a all parameters are like in FIG. 2, while in FIG. 3b the effective flip angle $\beta_3$ of the third pulse has been decreased to $\pi/4$. Note that for $\beta_3 = \pi/2$, zero-quantum excitation is very inefficient regardless of $\phi_3$.

Figure 4A:
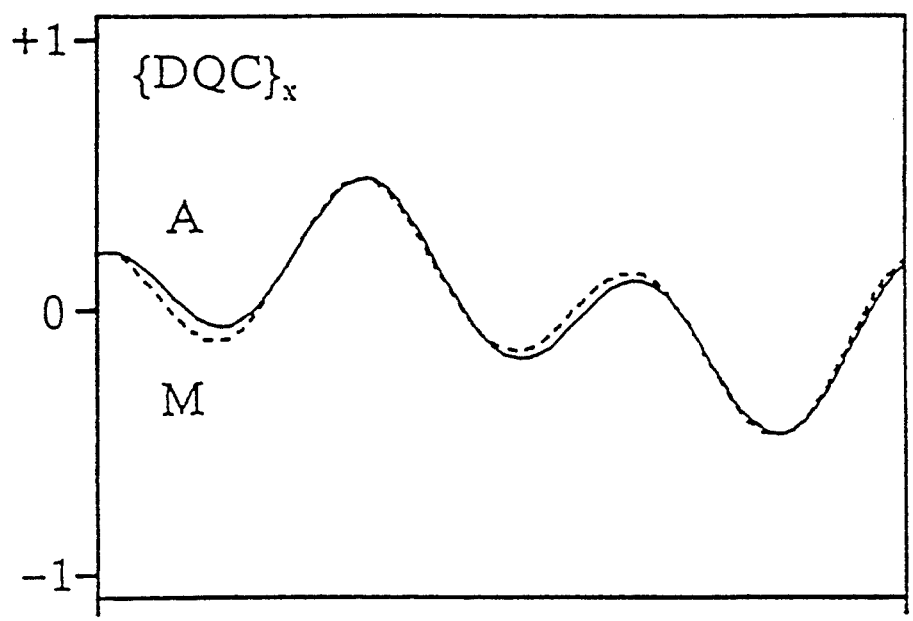
FIG. 4 the contributions from spin A (solid lines) and from spin M (dashed lines)
  a) to the double-quantum coherence and
  b) to the zero-quantum coherence as a function of phase $\phi_3$, the flip angle of the third pulse being $\beta = \pi/2$.
Figure 4B:
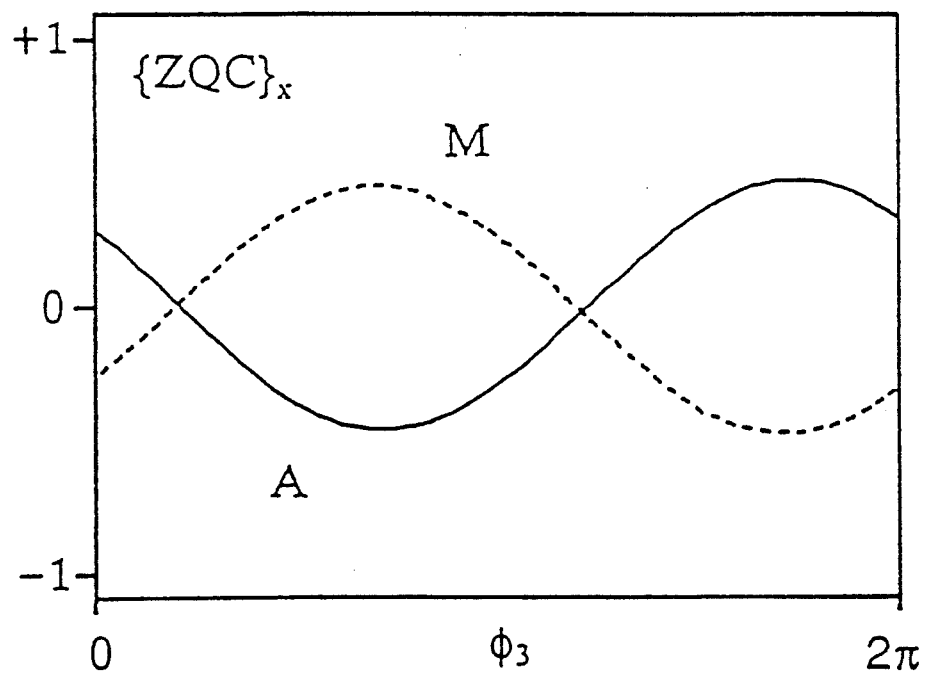

FIG. 4 shows how the two contributions stemming from spins A and M add up or cancel each other depending on the phase $\phi_3$ and the effective flip angle $\beta_3$ of the third pulse. If we have a $\pi/2$ pulse, the contributions to the zero-quantum coherence always cancel, as shown in FIG. 3a. This is in direct analogy with $(\pi/2 - \tau - \pi - \tau - \pi/2)$ sequences consisting of hard pulses, where zero-quantum coherence cannot be generated from antiphase magnetization by a $\pi/2$ pulse. If, however, we decrease the RF amplitude so that the effective flip angle of the third pulse is $\beta_3 = \pi/4$, and if the RF phase is in the vicinity of $\phi_3 = 0$ or 180°, we may obtain equal amounts of double-and zero-quantum coherences (see FIG. 3b). This behavior is again analogous to the classical experiment. Note that the naive pulse/evolution model discussed above does not allow one to predict the behaviour of FIG. 3, since it would suggest that maximum double-quantum excitation occurs if all three pulses have equal phases. A direct comparison with accurate simulations is difficult.

Figure 5:
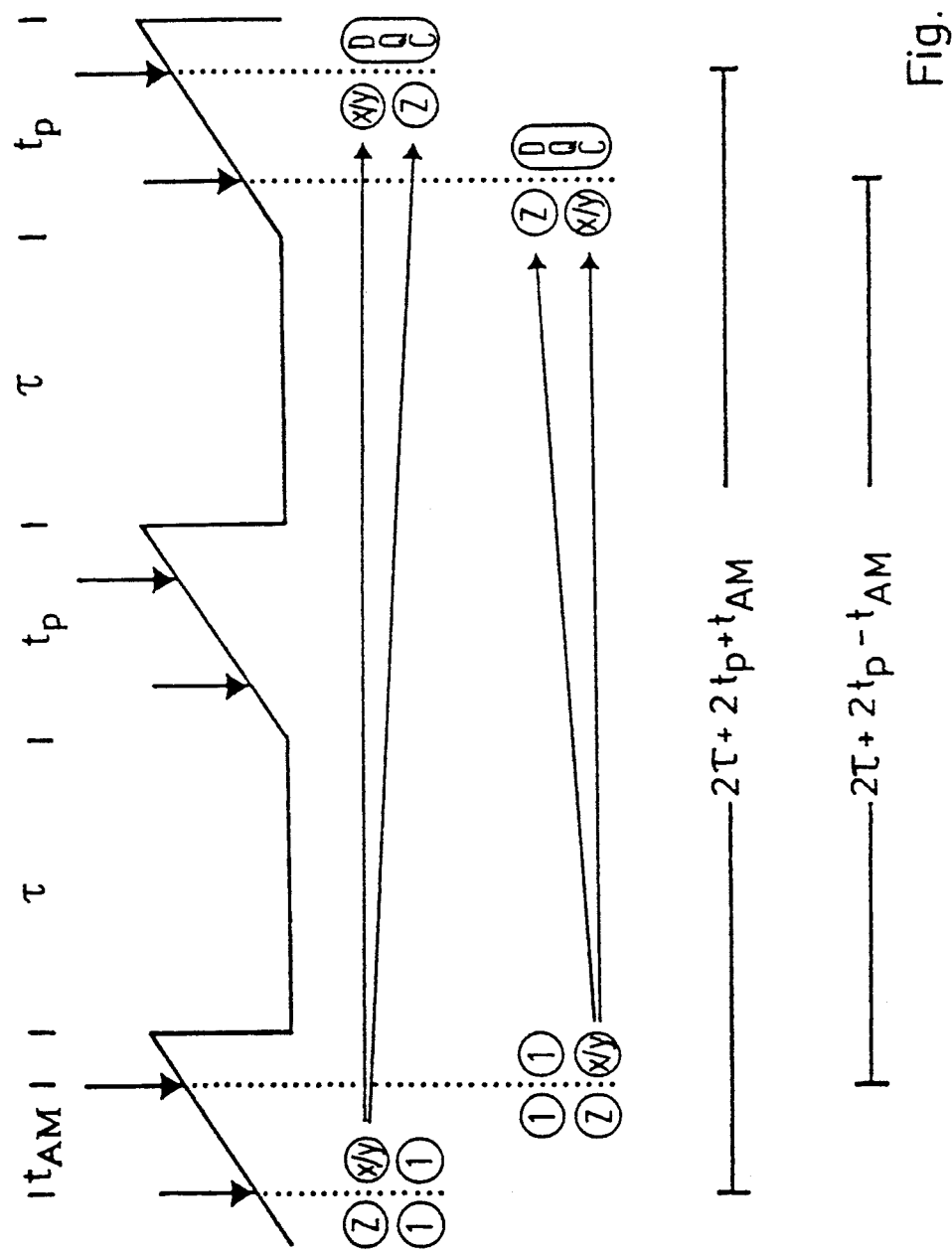
FIG. 5 graphs of the contributions to double-quantum coherence stemming from spins A and M.

FIG. 5 shows "product operator evolution graphs", using conventions discussed in publications of U. Eggenberger and G. Bodenhausen in Angew. Chm. 102, 392 (1990) and Angew. Chem. Int. Ed. Engl. 29, 374 (1990), which illustrate the pulse/evolution model. The two contributions to the double-quantum coherence stemming from spins A and M are shown separately. Zeeman order $I^A_z$ of spin A is first converted into inphase single-quantum coherence $I^A_{xy}$, which evolves during an interval $2\tau + 2t_p + t_{AM}$ into antiphase single-quantum coherence $2I^A_{xy}I^M_z$, that is finally converted into double-quantum coherence. On the other hand, $I^M_z$ is converted into $I^M_{xy}$, which evolves during an interval $2\tau+2t_p-t_{AM}$ into $2I^A_z I^M_{xy}$ before being transformed into double-quantum coherence. Ideally, the two different intervals $2\tau+2t_p \pm t_{AM}$ indicated in FIG. 5 should both be approximately equal to $(2J_{AM})^{-1}$, which clearly cannot be fulfilled unless $t_{AM} << (2J_{AM})^{-1}$.

In FIG. 5, the resonance frequencies are crossed at the times indicated by vertical dotted lines. The upper and lower circles in each graph correspond to spins A and M respectively. The symbols z, x/y and 1 in these circles represent operators $I_z$, $I_x$, or $I_y$ and the unity operator, respectively.

In addition to the two major pathways shown in FIG. 5, there may be further minor contributions to the double-quantum coherence if the coupling $J^{AM}$ is large enough to cause some conversion of in-phase into antiphase coherence in the interval $t_{AM}$. These pathways are most important if $t_{AM}$ is comparable to $(2_{AM})^{-1}$ in which case each chirp pulse taken in isolation can provide a significant amount of double-quantum coherence.

The one-bond scalar coupling constants $^1J_{CC}$ are usually all in the same range (about 40 Hz), but the chemical shifts of the carbon-13 spins may cover a very wide frequency range, typically 200 ppm (30 kHz in a 600 MHz spectrometer with a 150 MHz $C_{13}$-resonance frequency). These circumstances allow us to define guiding principles for the design of sequences of chirp pulses and for testing their performance by simulation and experiment.

Figure 6A:
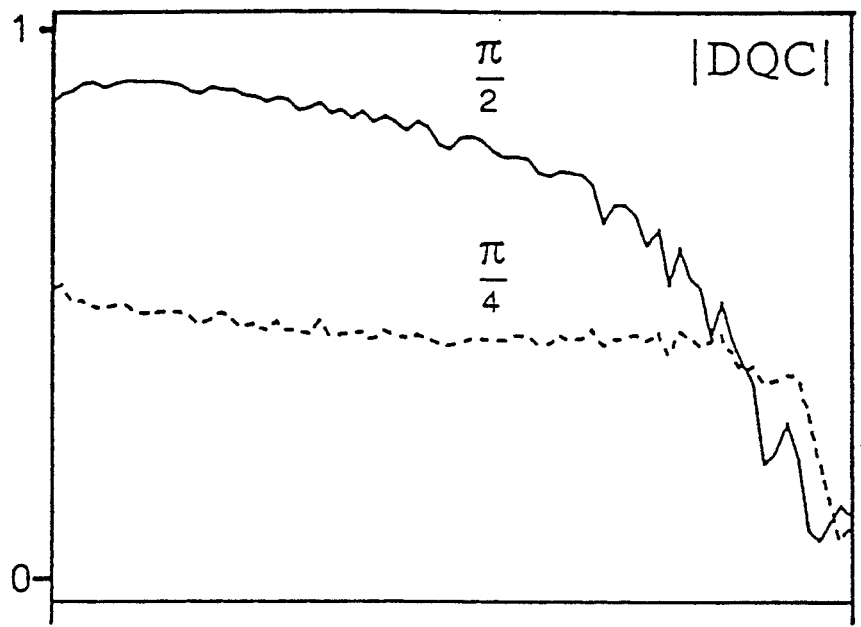
FIG. 6 the magnitudes of
  a) double-quantum coherence |DQC| and
  b) zero-quantum coherence |ZQC|
after the basic three-pulse chirp sandwich of FIG. 2.
Figure 6B:
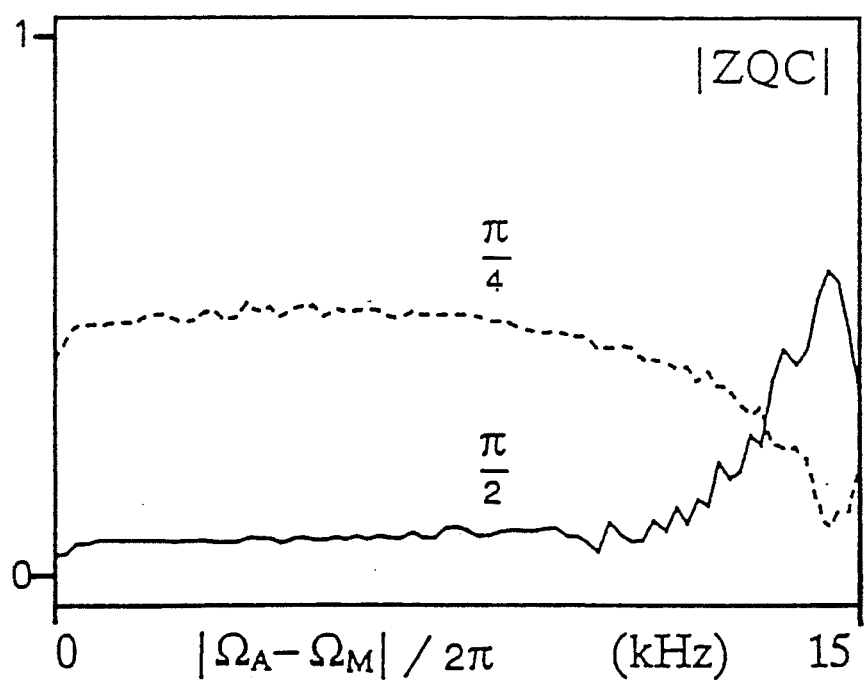

If all three pulses in the excitation sandwich of FIG. 2 have the same duration, the magnitude of the multiple quantum coherence created is offset-independent over most of the sweep range. FIG. 6 illustrates the offset-dependence of the zero- and double-quantum terms generated by the three-pulse excitation sequence.

The effective flip angle of the third pulse is set to either $\beta_3 = \pi/2$ (solid lines) or to $\beta_3 = \pi/4$ (dashed lines). The offset of $\Omega_A$ of spin A is fixed ($\Omega_A/2\pi = 5$ kHz) while $\Omega_M$ moves towards the right edge of the sweep, i.e. $\Omega_M/2\pi$ is varied from 5 to 20 kHz. The chirp pulses are swept from 0 to 20 kHz in 16 ms, like in FIG. 2.

Figure 7A:
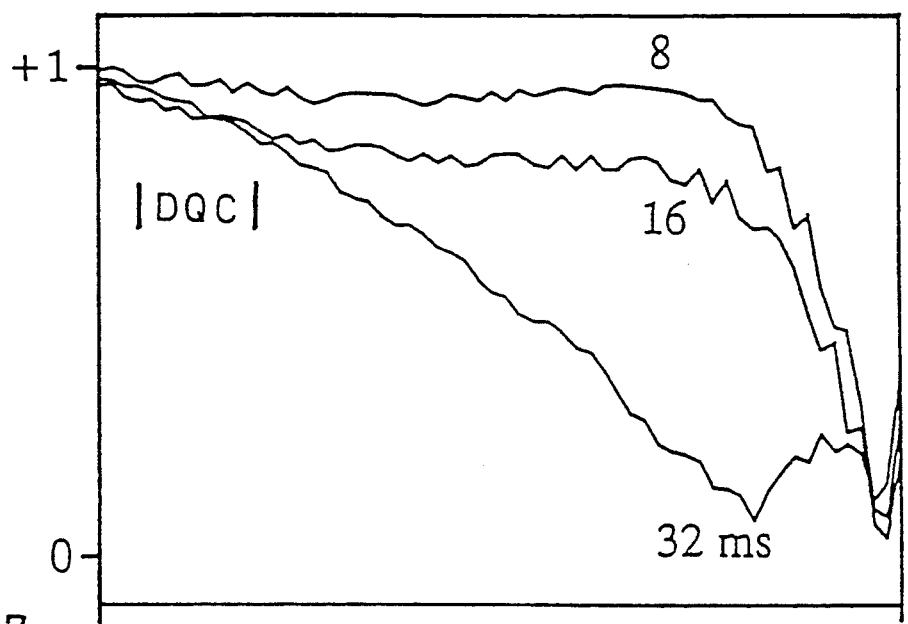
FIG. 7 the magnitudes of double-quantum coherence |DQC| excited by the basic sandwich with $\beta_3 = \pi/2$, according to a) numerical simulations and b) calculations based on the pulse/evolution model.
Figure 7B:
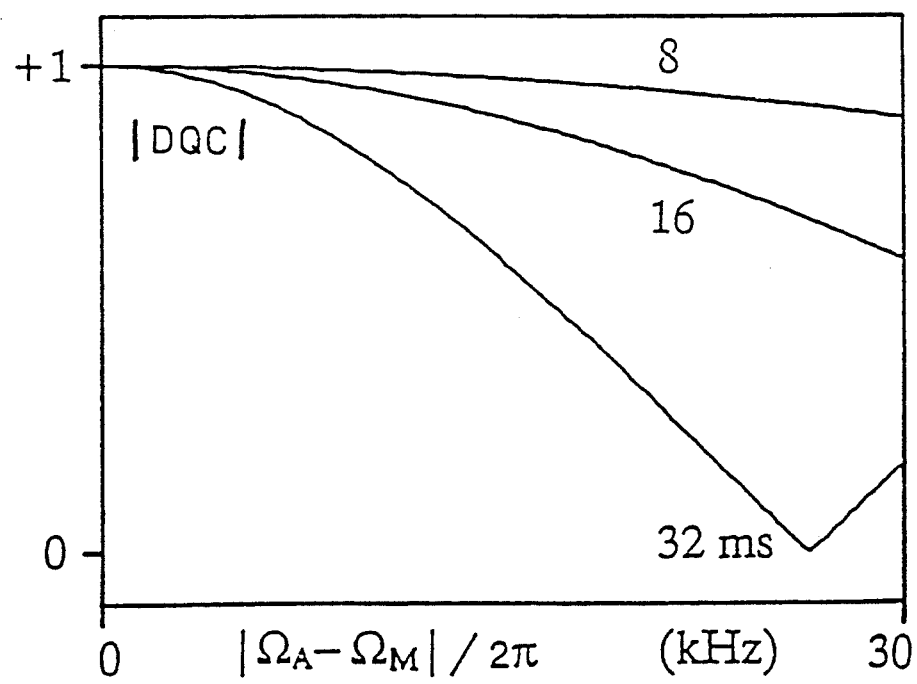

FIG. 7 compares exact calculations with approximate analytical predictions derived from the pulse/evolution model discussed above. We consider double-quantum excitation with the sequence of FIG. 2, using three different sweep rates. The tendency of the profile to drop with increasing relative offset is due to the fact that the two intervals highlighted in FIG. 5 cannot be optimized simultaneously for all pairs of spins. Unlike the crude pulse/evolution description in FIG. 7b, the numerical simulation in FIG. 7a correctly predicts so-called "edge effects" which arise from the finite range of the frequency sweep of the RF pulses.

The offset $\Omega_A$ of spin A is fixed at $\Omega_A/2\pi = 10$ kHz while $\Omega_M/2\pi$ is varied from 10 to 40 kHz. The chirp pulses are swept from 0 to 40 kHz with different sweep rates b. The durations $t_p$ of the chirp pulses are indicated. The RF amplitudes $\gamma B_1$ were adjusted in proportion to $\sqrt{b}$. The decreased performance for slower sweep rates can be explained by the increase of the interval $t_{AM}$ shown in FIG. 5. Note that edge effects are not accounted for by the pulse/evolution model.

It may appear surprising that the range of offsets over which the sequence is effective may be enlarged by increasing the sweep rate. Indeed, a fast sweep implies that the interval $t_{AM} = |\Omega_A - \Omega_M|/b$ is decreased relative to the interval $2\tau + 2t_p$ (see FIG. 5). The shorter $t_{AM}$, the closer we get to the ideal case where both intervals $2\tau + 2t_p \pm t_{AM}$ can approximate $(2J_{AM})^{-1}$ regardless of offsets. On the other hand, it appears that edge effects, which tend to worsen with increasing sweep rates, do not constitute too severe a drawback for a sequence using fast sweeps.

For simple adiabatic inversion, edge effects can be attenuated by smoothing the profile of the RF amplitude $\gamma B_1$ at the beginning and at the end of the sweep, for example by shaping with half-sine functions. However, we may conclude from simulations that this type of smoothing does not improve the offset-dependence of multiple quantum excitation with the sequence of FIG. 2. This is probably due to the fact that the efficiency of the sequence is sensitive not only to the relative RF phases but also to the relative amplitudes of the three pulses.

While the magnitude of the multiple quantum coherence generated by the excitation sandwich of FIG. 2 is thus largely uniform for all offsets, the phase is strongly frequency-dependent.

Figure 8:
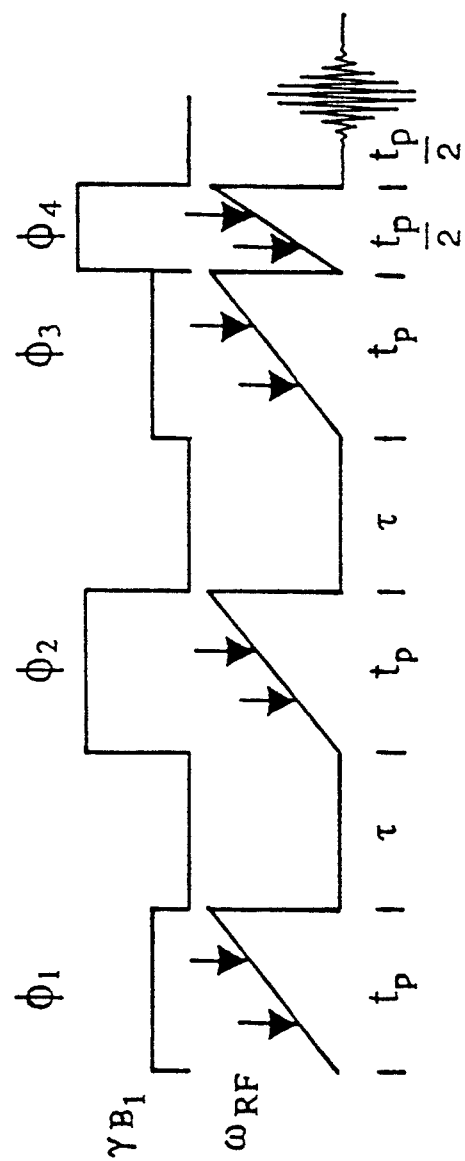
FIG. 8 the time-dependence of the RF-amplitude $\gamma B_1$ (top) and RF-frequency $\omega_{RF}$ (below) for an excitation sandwich followed by a chirp refocusing pulse acting on double-quantum coherence.

According to the present invention, the phase of the multiple-quantum coherence can be refocused by another chirp pulse. FIG. 8 shows a sequence where a fourth chirp pulse having twice the sweep rate and half the duration of the preceding pulse has been inserted immediately after the excitation sandwich leading to the formation of a double-quantum echo after a refocusing time delay $t_p$. At the time of the echo, the phase of the double-quantum coherence is to a large extent independent of the offsets of the two spins involved.

The phase $\psi_4$ of this pulse, which determines the phase of the double-quantum echo, can be chosen freely. The relative RF amplitudes $\gamma\beta_1$ of the four pulses in FIG. 8 were optimized to have ratios of 1:2.8:1:3.3.

This sequence does in fact allow one to obtain multiple-quantum coherences with uniform phases for all offsets. The dashed line in the lower part of FIG. 9 confirms that the offset-dependence of the double-quantum phase $\Phi = \arctan(\{DQC\}_y/\{DQC\}_x)$ is nearly flat.

Figures 9A, 9B:
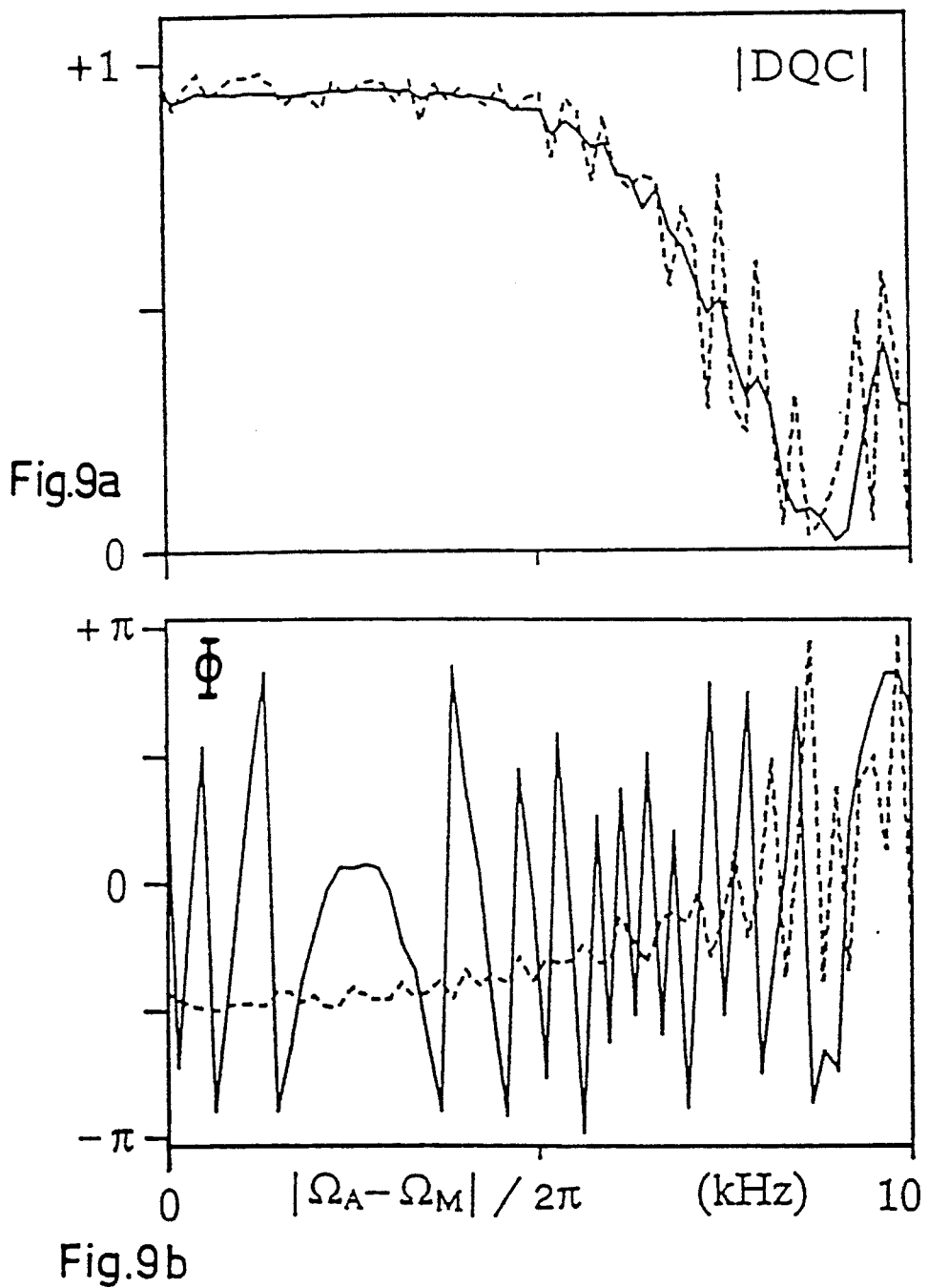
FIG. 9
  a) the magnitude |DQC| and
  b) the phase $\Phi$
of the double-quantum coherence as a function of the relative offsets of two spins, solid for sequence of FIG. 2, dashed lines for sequence of FIG. 8.

In FIG. 9 the offset $\Omega_A/2\pi = 10$ kHz is kept constant in the middle of the 20 kHz sweep range, while $\Omega_M/2\pi$ is incremented from 10 to 20 kHz towards the right edge. The solid lines in FIG. 9 show magnitude and phase immediately after the simple three-pulse sandwich of FIG. 2, i.e. without refocusing, whereas the dashed lines show magnitude and phase at the time of the echo in the sequence with double-quantum refocusing pulse of FIG. 8.

Once generated, refocused and allowed to evolve during an interval $t_1$, the multiple quantum coherence cannot simply be converted into observable single-quantum coherence by a single $\pi/2$ chirp pulse. Such a pulse would result in an offset-dependent mixture of antiphase single-quantum terms, residual multiple-quantum coherence, and longitudinal two-spin order $2I^A_z I^M_z$. In view of this difficulty, two approaches appear to be practicable in order to obtain in-phase single-quantum coherences at the beginning of the detection period $t_2$ of the two-dimensional experiment. The first involves preparing a particular phase distribution of the multiple quantum coherences as a function of offset before conversion into antiphase magnetization. The second method relies on the concept of symmetrical excitation and detection, where the preparation and detection parts of the multiple-quantum experiment are matched to achieve apparent time-reversal.

Figure 10A:
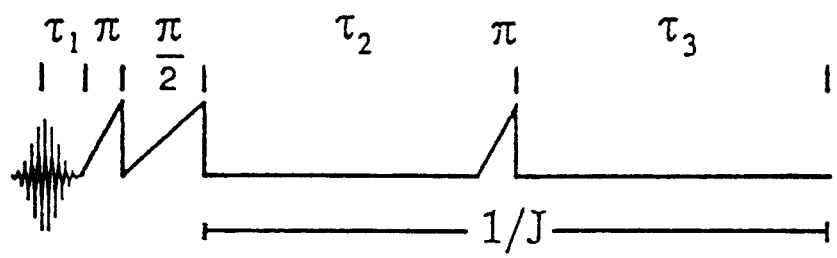
FIG. 10 the time-dependence of
  a) a reconversion sequence of chirp pulses and
  b) the corresponding $|2I^A_{XY}I^M_z|$ -term.
Figure 10B:
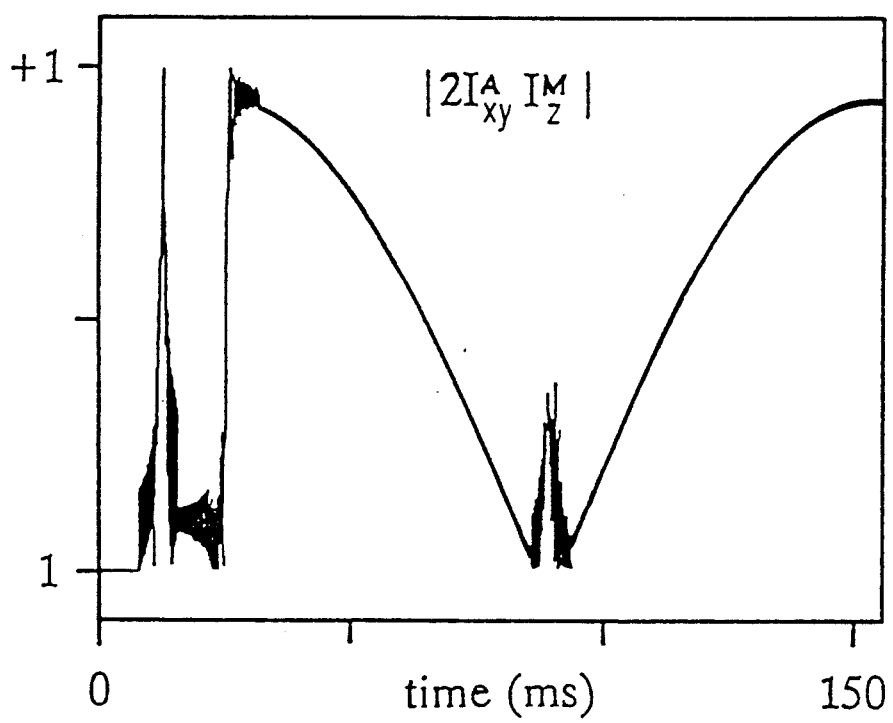

Since the sequence of FIG. 8 allowed us to refocus double quantum coherences created at different points in time during the third pulse, we might, conversely, deliberately "spread out" the phases of the double quantum coherences prior to reconversion into single-quantum coherence. In this manner, we can ensure that there is a suitable relationship between the instantaneous RF phase and the phase of the double-quantum coherence at the points $t_A$ and $t_M$ (see FIG. 1) where the RF field sweeps through the resonances of spins A and M. As shown in FIG. 10, this can be achieved by letting the double-quantum coherence dephase after the echo, which is assumed to consist of pure $\{DQC\}_x$ and by applying a chirp refocusing pulse with an effective flip angle $\pi$ of duration $t_p/2$, i.e. with twice the sweep rate as the pulses of duration $t_p$. The subsequent chirp $\pi/2$ pulse of duration $t_p$ brings about the conversion into (antiphase) single-quantum coherence. The initial RF phase of this pulse must be chosen for optimum transfer. In this manner, the amplitude (but not the phase) of the observable magnetization thus recovered is uniform for all pairs of resonance frequencies $\Omega_A$ and $\Omega_M$. Loosely speaking, the entire process is the reverse of what happens between the third pulse and the echo in FIG. 8.

When in FIG. 10 the second pulse crosses the resonance frequencies, the relationship between the double-quantum phase and the RF phase is such that the conversion into $2I^A_{xy}I^M_z$ (and into $2I^A_zI^M_{xy}$, not shown here) occurs properly. These antiphase single-quantum terms are then allowed to turn into in-phase terms $I^A_{xy}$ and $I^M_{xy}$ (also not shown), which are refocused by a chirp refocusing pulse to form an echo of antiphase single-quantum coherence at the end of the $\tau_3$ interval. All pulses are swept over 20 kHz. The $\pi$ and $\pi/2$ pulses have durations of 8 and 16 ms, and the RF amplitudes are 1020 and 309 Hz respectively, the initial RF phase of the second pulse being shifted by 246° with respect to the first pulse. The offsets are $\Omega_A = 8$ and $\Omega_M = 12$ kHz. The delays are $\tau_1 = 8$, $\tau_2 = 54.5$ and $\tau_3 = 62.5$ ms, where $\tau_3 = \tau_2 + \tau_\pi$. The latter two were adjusted so that $\tau_2 + \tau_\pi + \tau_3 = 1/J_{AM}$, with $J_{AM} = 8$ Hz.

Figure 11A:
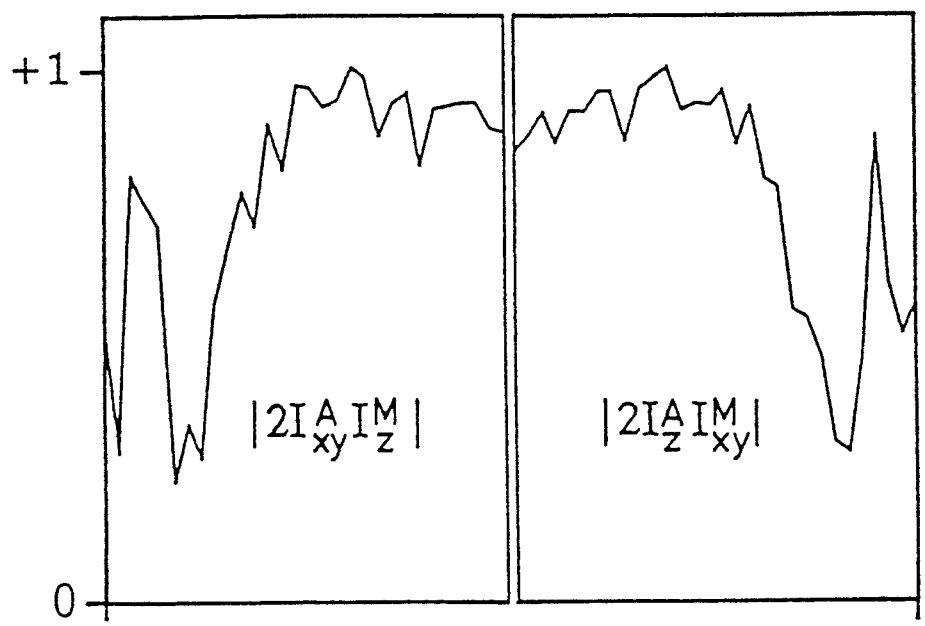
FIG. 11
  a) the magnitudes $|2I^A_{XY}I^M_z|$ and $|2I^A_z I^M_{XY}|$ and
  b) the phases $\Phi_A$ and $\Phi_M$
of the antiphase single-quantum terms generated by reconversion from double-quantum coherence, as a function of offsets $\Omega_A$ and $\Omega_M$.
Figure 11B:
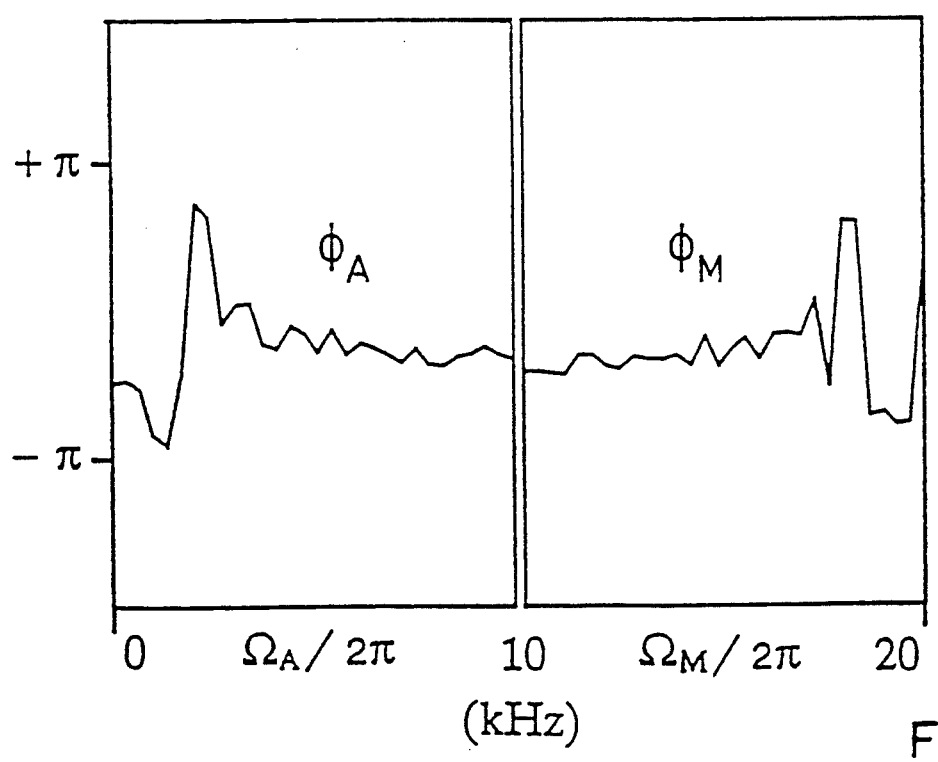

FIG. 11 shows the efficiency of the reconversion sequence of FIG. 10 for pairs of spins with different offsets. For all spin pairs we start with pure $\{DQC\}_x$ at the time of the echo (see pulse sequence of FIG. 10). The offsets were varied symmetrically from 0 up to 10 kHz for $\Omega_A/2\pi$ and from 20 down to 10 kHZ for $\Omega_M/2\pi$, while all chirp pulses were swept from 0 to 20 kHz. The pulses durations, RF amplitudes, RF phases and intervals are like in FIG. 10.

Thus it is indeed possible, starting from double quantum coherences aligned along the x-axis for all pairs of offsets $\Omega_A$ and $\Omega_M$, to obtain a uniform magnitude of antiphase single-quantum terms over a wide range of offsets. However, if we recorded the (antiphase) signals immediately after the second pulse in the sequence of FIG. 10, there would be a strong offset-dependent phase dispersion. Such an experiment would allow one to have pure absorptive line-shapes in the $\omega_1$ dimension, but not in the $\omega_2$ dimension of the resulting frequency domain.

The second approach to detection is based on the idea of symmetrical excitation and reconversion into $t_1$-modulated populations, which can then be transferred in into observable magnetization.

If one prepares a spin system by a sequence of transformations in a desired state, for example consisting of multiple quantum coherence, it is possible under certain conditions to undo all the previous transformations and recover the initial state of equilibrium magnetization.

Figure 12:
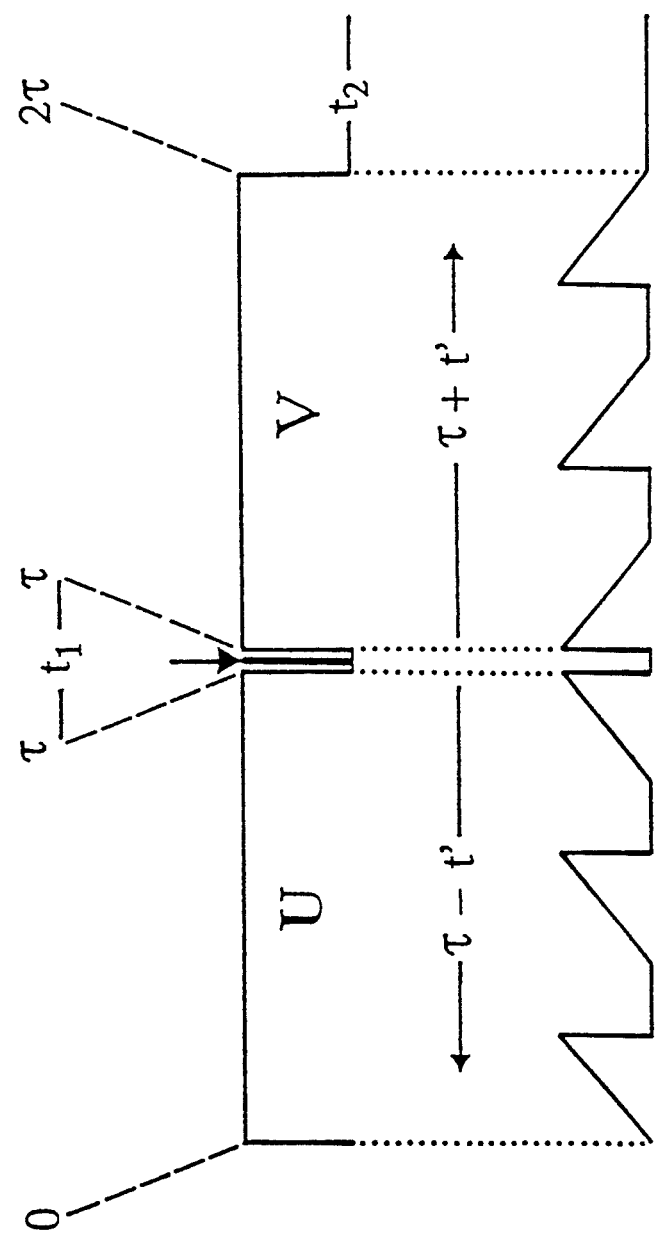
FIG. 12 the time-dependence of an RF-pulse sequence for excitation and reconversion of double-quantum coherence into Zeeman-terms using time reversal.

In the following we shall associate the preparation and reconversion parts of the sequence of FIG. 12 with the propagators U and V. By inserting an evolution interval $t_1$ between the preparation and reconversion parts, one obtains longitudinal Zeeman magnetization modulated as $\cos(\Omega_A + \Omega_M)t_1$. This may subsequently be converted into observable transverse magnetization by a hard $\pi/2$ pulse or, preferably, by an echo sequence consisting of a chirp $\pi/2$ pulse immediately followed by a chirp $\pi$ pulse with twice the sweep rate.

Each of the propagators U and V represents a sandwich of three chirp pulses of total duration $\tau$. If the evolution period is $t_1 = 0$, and if a non-selective, hard $\pi$ pulse is inserted between U and V (vertical arrow), the effect of V is to reconvert the double-quantum coherence created by U back into Zeeman terms $I^A_z$ and $I^M_z$ of the two spins A and M over a wide range of offsets $\Omega_A$ and $\Omega_M$.

The effect of the preparation propagator U may be "undone" (or "reversed in time") by the action of the propagator V if we can fulfill the condition that $V = U^{-1}$. This corresponds to the requirement that $H_V = -H_U$ for the corresponding (hermitian) Hamiltonian operators. These relations may be easily understood if we consider the expectation value of the z component $I_z = I^A_z + I^M_z$ of the magnetization immediately after reconversion in the two-dimensional experiment of FIG. 12 with an evolution interval $t_1$:

$$<I_z> = tr\{I_z[V\exp(-iH_0t_1)UI_zU^{-1}\exp(iH_0t_1)V^{-1}]\} \quad (5)$$

where $U = \exp(-i\int H_U(t)dt)$, and $H_0$ is the free precession Hamiltonian of Eq. (1). If $t_1 = 0$, we have $$S = tr\{(V^{-1}I_zV)(UI_zU^{-1})\}, \quad (6)$$

so if $U^{-1} = V$ (i.e. if $H_V = -H_U$) we obtain the maximum possible signal, $tr\{I_z^2\}$. As the sign of the complete Hamiltonian cannot simply be inverted in practice, one has to investigate in how far a modification of quantities like RF amplitude, phase and frequency can have an effect similar to exact time reversal. Let us first consider the Hamiltonian corresponding to a chirp pulse acting on an isolated spin.

$$H_U(t) = \Omega_A(t)I^A_z + \gamma B_1(I^A_x \cos\phi + I^A_y \sin\phi) \quad (7)$$

with the offset $\Omega_A(t) = \omega_{A0} - \omega_{RF}(t)$ with respect to the time-dependent transmitter frequency. With reference to FIG. 12, we must have the same offset and the same RF amplitude at symmetrical times $\tau - t'$ and $\tau + t'$, where $\tau$ corresponds to the end of the preparation period and to the beginning of the reconversion period:

$$\Omega_A(\tau - t') = \Omega_A(\tau + t') \text{ or } \omega_{RF}(\tau - t') = \omega_{RF}(\tau + t') \quad (8)$$

and $\gamma B_1(\tau - t') = \gamma B_1(\tau + t')$

This implies that the direction of the sweep must be changed. If we now choose phases such that the Hamiltonian $H_V$ associated with the propagator V is the complex conjugate of $H_U$, i.e. if $$H_V(\tau+t')=H_{U^*}(\tau-t')=\Omega_A(\tau-t')I^A{}_z+\gamma B_1(I^A{}_x \cos\phi - I^A{}_y \sin\phi), \quad (9)$$

such that $U^*=V^{-1}$, it can be shown that we obtain the signal $\mathrm{tr}\{(U^{-1}I_zU)^2\}$ instead of $\mathrm{tr}\{|U^{-1}I_zU|^2\}$ for perfect time reversal. In terms of matrix elements we have $S=\Sigma_{ij}\rho_{ij}{}^2$ and $S=\Sigma_{ij}\rho_{ij}\rho_{ij}{}^*$, respectively, where $\rho_{ij}=(U^{-1}I_zU)_{ij}$. The two expressions differ by a phase factor, and of the first we can only say that we will achieve maximum average signal intensity over $t_1$. In-phase signals may in fact be obtained if we have, during the evolution interval, precession associated with so-called spin-inversion transitions. Such transitions $|i\rangle\langle j|$ can be converted into their complex conjugates $|j\rangle\langle i|$ by a $\pi_x$ pulse, and if we apply such a pulse during evolution, we do obtain the equivalent of exact time reversal. In a two-spin system, the double-quantum coherence $|\alpha\alpha\rangle\langle\beta\beta|$ and the zero-quantum coherence $|\alpha\beta\rangle\langle\beta\alpha|$ both correspond to spin inversion transitions.

If we now introduce the scalar coupling term $H_J=2\pi J I_A\cdot I_M$ as in Eq. (1), we must note that there is no obvious means to invert the sign of this term, except perhaps with selective pulses, which we should like to avoid. One possible solution to this problem is to tailor the pulse sequence to the time-dependence arising from the coupling term. This can be achieved if the end of the preparation period coincides with the point where the coupling has entirely converted in-phase magnetization into antiphase terms. As the three-pulse sandwich sequence of FIG. 2 relies on creating a maximum of antiphase terms anyway, this condition is fulfilled quite naturally. In the $t_1$ interval we have only double- and zero-quantum coherences, which we may refocus with a hard $\pi$ pulse because they correspond to spin inversion transitions.

Of course, this $\pi$ pulse appears as an unorthodox element in a sequence consisting otherwise only of chirp pulses. In principle, this pulse may be dropped if the multiple-quantum coherence generated under the action of the propagator U has, for all offsets, a phase of $\phi=0$, i.e. if $\rho_{ij}=(U^{-1}I_zU)_{ij}$ is purely real. For this purpose, we can in principle use the refocusing sequence discussed above, since it generates double- and zero-quantum coherences with a common phase for all pairs of offsets. However, we need specific values for the phases and amplitudes of all pulses in order to obtain multiple-quantum coherence along the x-axis.

Figure 13A:
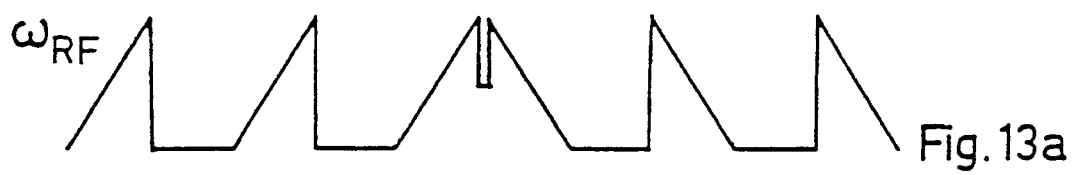
FIG. 13 the time-dependence of
  a) the RF-frequency $\omega_{RF}$ of a RF-pulse sequence like in FIG. 12 and the magnitudes of the corresponding
  b) antiphase single-quantum coherence $2I^A_z I^M_{xy}$ and
  c) double-quantum term DQC.
Figure 13B:
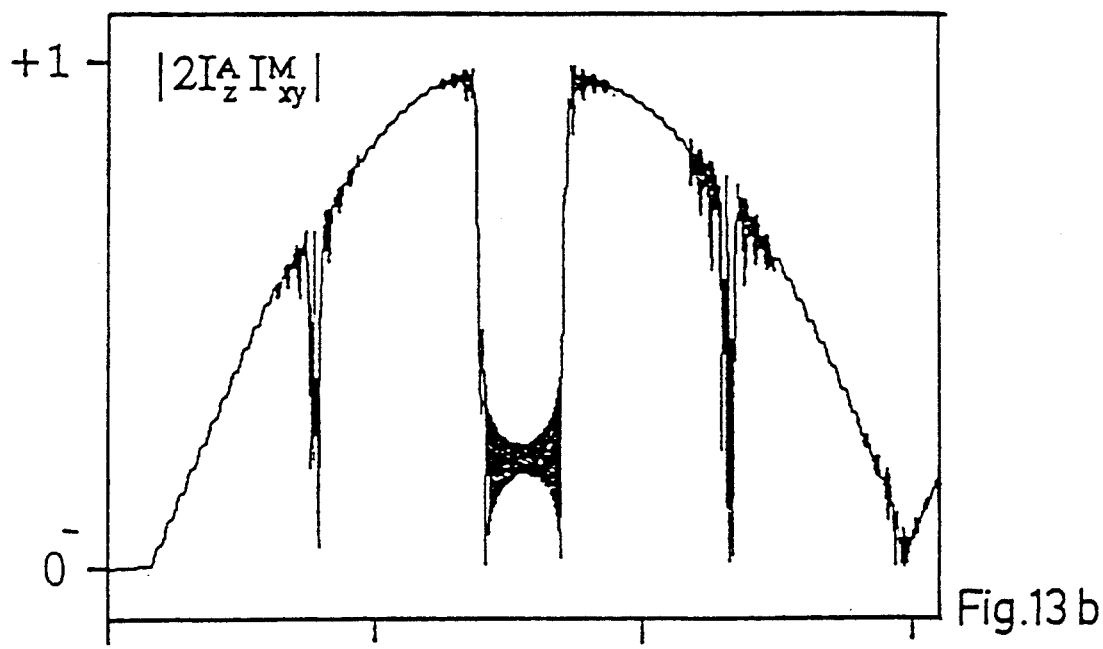
Figure 13C:
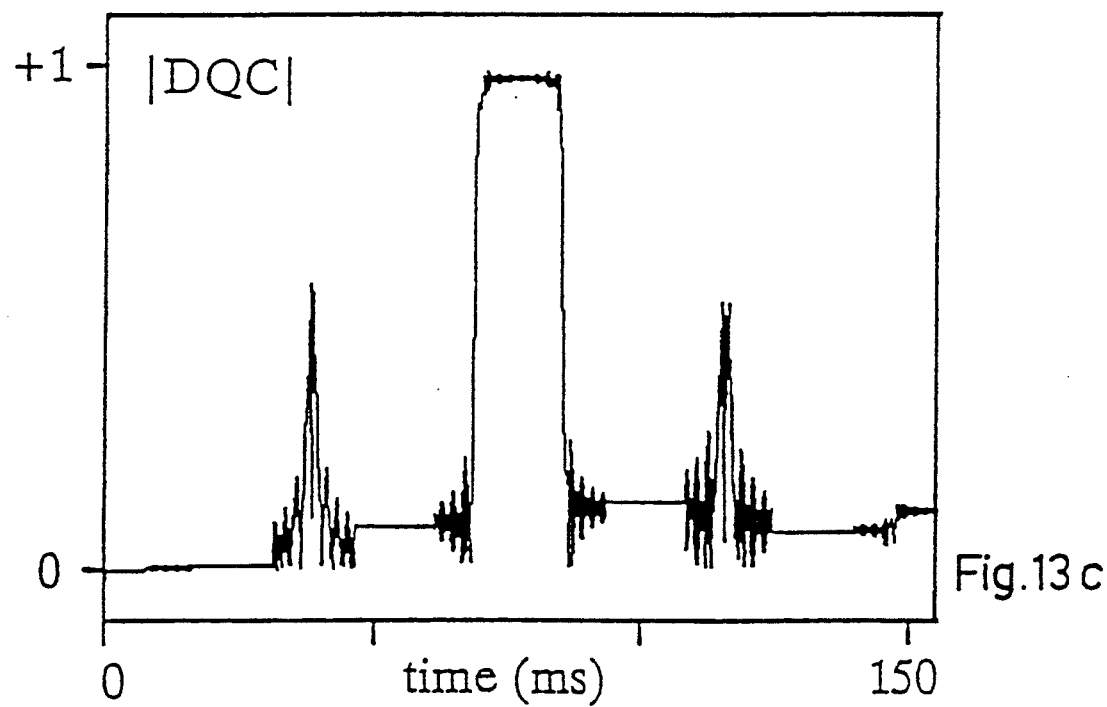

FIG. 13 illustrates the time evolution of the magnitude of an antiphase single-quantum term and of the double-quantum coherence during the proposed time reversal sequence, shown for $t_1=0$. The phases during the reconversion part have been changed in sign with respect to those of the preparation period in order to fulfill the condition of Eq. (9).

A hard $\pi$ pulse (not shown) is applied between excitation and reconversion. The RF frequencies of the chirp pulses are swept up and down between 0 and 20 kHz in 16 ms, with RF amplitudes $\gamma B_1=309$ and 860 Hz for the $\pi/2$ and $\pi$ pulses respectively, like in FIG. 2. The resonance frequencies are fixed at $\Omega_A/2\pi=9$ and $\Omega_M/2\pi=11$ kHz, with $J_{AM}=8$ Hz. Note that the initial Zeeman order is almost entirely converted into double-quantum coherence.

Figure 14:
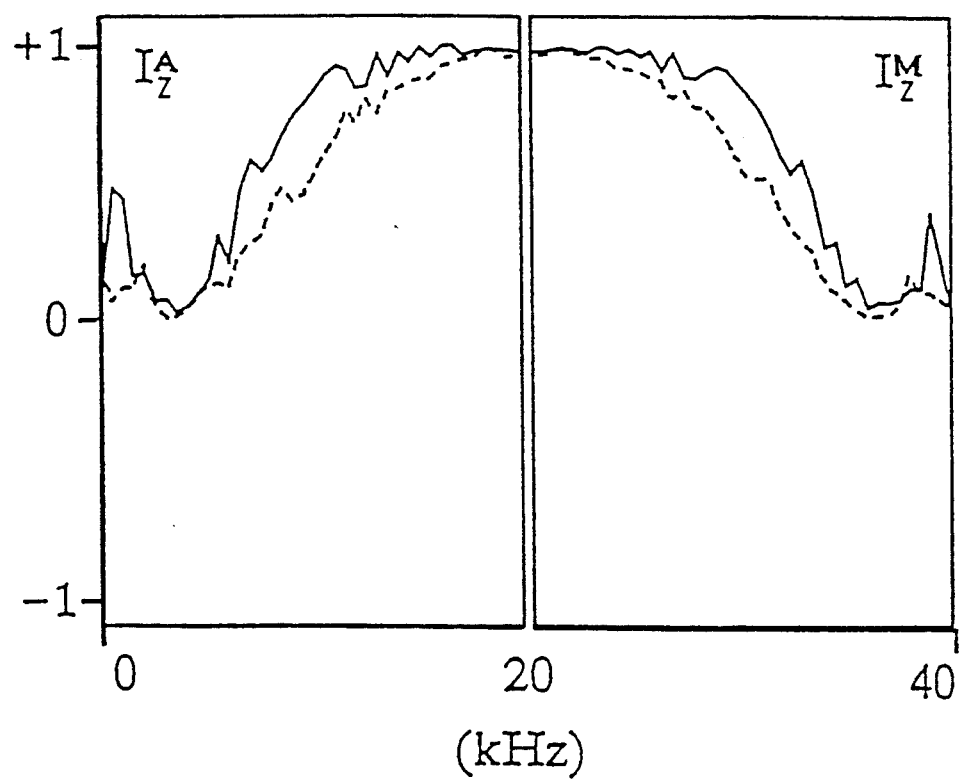
FIG. 14 the Zeeman terms $I^A_z$ and $I^M_z$ reconverted from double-quantum coherence as a function of offsets.

FIG. 14 shows that the profile of the longitudinal magnetization obtained at the end of the sequence is largely offset-independent. The performance tends to improve with increasing sweep rates, like in FIG. 7.

The Zeeman terms $I^A{}_z$ and $I^M{}_z$ reconverted from double-quantum coherence are shown as a function of offsets which were varied symmetrically from 0 up to 20 kHz for $\Omega_A/2\pi$ and from 40 down to 20 kHz for $\Omega_M/2\pi$. The solid line shows the response to chirp pulses swept between 0 and 40 kHz in 8 ms, with RF amplitudes $\gamma B_1=618$ and 1720 Hz for the $\pi/2$ and $\pi$ pulses respectively and a phase $\phi_3=122°$. The dashed line corresponds to a 40 kHz sweep in 16 ms, with $\gamma B_1=440$ and 1220 Hz and $\phi_3=52°$.

The final conversion of $I_z$ generated by the propagator V into observable single-quantum coherence may be achieved by an echo sequence composed of a chirp $\pi/2$ pulse followed by a chirp $\pi$ pulse having half the duration and between 2 and 4 times, preferably 2.8 times the amplitude of the preceding chirp $\pi/2$ pulse.

Experiments have been carried out on a Bruker AM-400 spectrometer equipped with an Oxford Research Systems selective excitation unit. Chirp pulses were generated by modulating the phase as a quadratic function of time, i.e. $\phi=\frac{1}{2}b(t-t_0)^2$, where $t_0$ corresponds to the center of the pulse, and where b is the sweep rate. Files created by a Pascal program running on the Aspect 3000 computer were transformed by the Bruker SHAPE package to create the data for the waveform memory.

Figure 15:
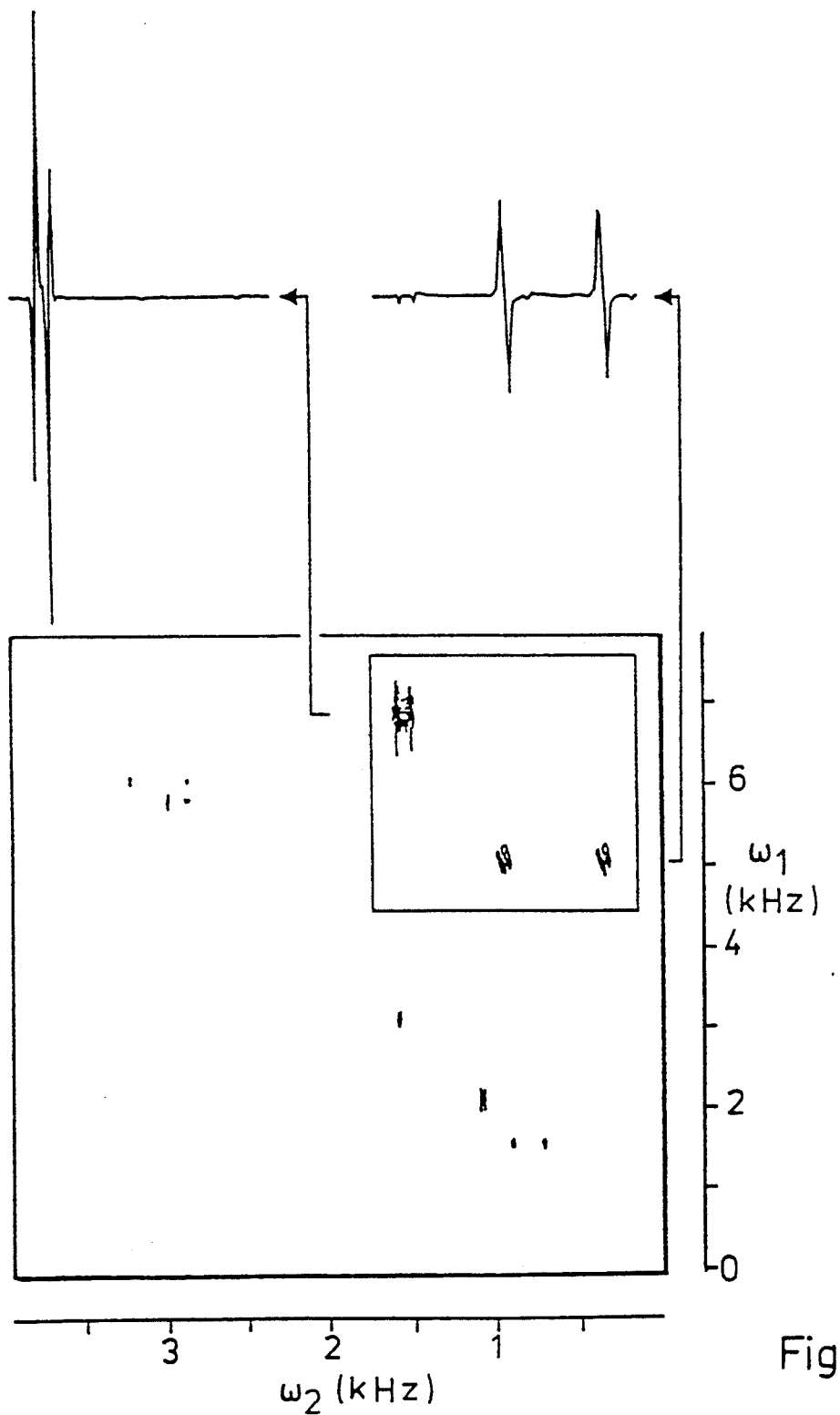
FIG. 15 an experimental double-quantum spectrum of a proton spin system with expanded region showing the two 2-spin subsystems with couplings $J_{AM} = 5$ and $J_{A'M'} = 15$ Hz.

Double-quantum experiments were performed on proton systems. These experiments combine refocused double-quantum excitation of FIG. 8 with a "hard" $\pi/2$ monitoring pulse at the time of the echo. FIG. 15 shows a spectrum of (1RS, 2SR, 4RS, 5RS, 6RS)-exo-(2-nitrophenylthio)spiro [bicyclo[2.2.2] octane-2,2'-oxirane]-5-endo-yl chloride, which contains two subsystems with two scalar-coupled protons with $J_{AM}=5$ Hz and $J_{A'M'}=15$ Hz. Since these couplings are multiples of each other, the delays in the experiment can be optimized simultaneously for both subsystems. The chirp pulses had a duration $t_p=8$ ms, the $\tau$ delays 42 ms, so that total duration of the excitation sandwich was 100 ms $\approx (2J_{AM})^{-1} \approx 3(2J_{A'M'})^{-1}$.

Because of storage limitations, only 256 time intervals could be defined for each pulse, and the phase increments were selected so that the frequency sweep was limited to a window of $\pm 5$ kHz on either side of the carrier frequency. For the first and last time intervals within each pulse, the phase increments were 0.98 rad. Simulations were used to optimize the RF amplitudes and phases under these conditions of relatively coarse digitization. The optimum amplitudes $\gamma B_1$ of the four pulses in FIG. 8 were found to be 309, 860, 309, and 1020 Hz, respectively. The phases of the last two pulses were shifted by 150° with respect to the first two. In the experiment, the best results were obtained by calibrating the amplitude $\gamma B_1$ of a single chirp pulse for maximum creation of transverse magnetization, and by setting the amplitudes of the other pulses in proportion to the optimized values, i.e. 1:2.8:1:3.3. By cycling the phase of the hard reconversion pulse and of the receiver, undesired signals due to zero- and single-quantum coherences could be suppressed.

The spectrum in FIG. 15 shows pairs of multiplets symmetrically disposed with respect to the skew double-quantum diagonal $\omega_1=2\omega_2$, at frequencies $\omega_1=(\Omega_A+\Omega_M)$ and $\omega_2=\Omega_A$ and $\Omega_M$. The cross-sections clearly reveal the antiphase up/down character of the doublets for each of the two subsystems.

Selected cross-sections taken parallel to the $\omega_2$ axis show the antiphase structure of the doublets. The spectrum was obtained with the four-pulse chirp sequence with double-quantum refocusing of FIG. 8, followed by a non-selective "hard" $\pi/2$ pulse for reconversion into antiphase single-quantum coherence. The spectral widths were 10 and $\pm 5$ Hz in $\omega_1$ and $\omega_2$, the data matrix was 512×4K before and 1K×1K after zero-filling. Chirp pulses were generated by phase modulation of the RF carrier.

Installations enabling performance of the method according to the invention, i.e. excitation of multiple-quantum coherence by means of a first sequence of chirp RF-pulses and reconverting the multiple-quantum coherence into transverse magnetization by means of a second sequence of chirp RF-pulses will be of advantage in spectrometers adapted to perform two-dimensional exchange spectroscopy ("NOESY"), correlation spectorscopy ("COSY"), heteronuclear and homonuclear correlation spectroscopy which are sensitive to large offsets and also in NMR-imaging experiments and especially in NMR-in-vivo-spectroscopy. It is intended that such installations also belong to the subject matter of the invention and are comprised by the scope of the claims.

The frequency-modulated chirp pulse sequences proposed by the present invention hold considerable promise for extending double-quantum spectroscopy to systems with wide spectral ranges, as indeed occur in the case of pairs of carbon-13 spins at high fields. It is understood, that the method according to the invention can be applied to all kinds of nuclear magnetic systems.

Substantial progress can be made by systematic use of frequency modulation. The chirp pulse sequences according to the present invention are applicable to a wide variety of one-and two-dimensional experiments involving coherence transfer, to systems with quadrupolar couplings in anisotropic phase, and to dipolar-coupled systems.

TABLE 1

| | | |
|---|---|---|
| $\|I_{xy}^A\|$ | = | $[(I_x^A)^2 + (I_y^A)^2]^{\frac{1}{2}}$ |
| $\|2I_{xy}^A I_z^M\|$ | = | $[(2I_x^A I_z^M)^2 + (2I_y^A I_z^M)^2]^{\frac{1}{2}}$ |
| $\|2I_z^A I_{xy}^M\|$ | = | $[(2I_z^A I_x^M)^2 + (2I_z^A I_y^M)^2]^{\frac{1}{2}}$ |
| $\{ZQC\}_x$ | = | $\frac{1}{2}(2I_x^A I_x^M + 2I_y^A I_y^M)$ |
| $\{ZQC\}_y$ | = | $\frac{1}{2}(2I_y^A I_x^M - 2I_x^A I_y^M)$ |
| $\{DQC\}_x$ | = | $\frac{1}{2}(2I_x^A I_x^M - 2I_y^A I_y^M)$ |
| $\{DQC\}_y$ | = | $\frac{1}{2}(2I_x^A I_y^M + 2I_y^A I_x^M)$ |
| $\|ZQC\|$ | = | $[\{ZQC\}_x^2 + \{ZQC\}_y^2]^{\frac{1}{2}}$ |
| $\|DQC\|$ | = | $[\{DQC\}_x^2 + \{DQC\}_y^2]^{\frac{1}{2}}$ |

We claim:

1. In a method which includes the step of exciting a multiple quantum coherence in an NMR pulse experiment, said exciting step including the steps of subjecting a nuclear spin system to a magnetic field and irradiating said nuclear spin system, while subjected to said magnetic field, with a first sequence of RF pulses which includes a basic sequence having a first $\pi/2$-pulse, a first $\pi$-pulse generated after a defocusing time interval $\tau$ following the first $\pi/2$-pulse, and a $\pi/2$-pulse generated after another time interval $\tau$ following the first $\pi$-pulse, said method further including the step of reconverting said excited multiple quantum coherence into a transverse magnetization for inducing a free induction decay, said reconverting step including the step of irradiating said nuclear spin system with a second sequence of RF pulses; the improvement comprising wherein said step of irradiating with said first sequence of RF pulses includes the step of generating each of the three RF pulses of said basic sequence as a chirp pulse having a duration $t_p$ by sweeping the frequency of the exciting RF field in a monotonic fashion with respect to time during said duration $t_p$ between a lower limit frequency $\omega_{RFmin}$ and an upper limit frequency $\omega_{RFmax}$; and wherein said step of irradiating with said second sequence of RF pulses includes the step of generating as one of the pulses of said second sequence a fourth chirp pulse with a duration $t_p/2$ and an amplitude between 2 and 4 times the amplitude of said first $\pi/2$-pulse.

2. The method according to claim 1, applied to one of NMR-imaging and NMR-in-vivo-spectroscopy.

3. The method according to claim 1, applied to heteronuclear correlation spectroscopy.

4. In a method which includes the step of exciting a multiple quantum coherence in an NMR pulse experiment, said exciting step including the steps of subjecting a nuclear spin system to a magnetic field of high field strength and irradiating said nuclear spin system, while subjected to said magnetic field of high field strength, with a first sequence of RF pulses which includes a basic sequence having a first $\pi/2$-pulse, a first $\pi$-pulse generated after a time interval $\tau$ following the first $\pi/2$-pulse, and a second $\pi/2$-pulse generated after another time interval $\tau$ following the first $\pi$-pulse, said method further including the step of reconverting said excited multiple quantum coherence into a transverse magnetization for inducing a spin echo, said reconverting step including the step of irradiating said nuclear spin system with a second sequence of RF pulses; the improvement comprising wherein said step of irradiating with said second sequence of RF pulses includes the steps of generating, a dephasing time interval $\tau_1$ following the spin echo, a chirp refocusing $\pi$-pulse having a duration $t_p/2$ by sweeping the frequency of the RF field monotonically with respect to time during said duration $t_p/2$ between a lower limit frequency $\omega_{RFmin}$ and an upper limit frequency $\omega_{RFmax}$ and generating a subsequent chirp $\pi/2$-pulse of furation $t_p$.

5. The method according to claim 4, wherein said step of irradiating with said second sequence of RF pulses includes the step of generating as one of the pulses of said second sequence of RF pulses a further chirp $\pi$-pulse of duration $\tau_\pi = t_p/2$ a time delay $\tau_2$ following said subsequent chirp $\pi/2$-pulse, and the step of detecting a spin echo resulting from said further chirp $\pi$-pulse a final delay $\tau_3$ following said further chirp $\pi$-pulse.

6. The method according to claim 5, including the steps of selecting said time delay $\tau_2$ so that $\tau_2 \approx 0$, and selecting said final delay $\tau_3$ so that $\tau_3 \approx \tau_\pi$.

7. The method according to claim 5, including the steps of selecting said time delay $\tau_2$ so that $\tau_2 \approx (2J_{AM})^{-1}$, and selecting said final delay $\tau_3$ so that $\tau_2 + \tau_\pi + \tau_3 \approx J_{AM}^{-1}$, where $J_{AM}$ designates a scalar coupling constant for coupling between spin A and spin M.

8. The method according to claim 5, including the steps of selecting said time delay $\tau_2$ so that $\tau_2 \approx (4J_{AM})^{-1}$, and selecting said final delay $\tau_3$ so that $\tau_2 + \tau_\pi + \tau_3 \approx (2J_{AM})^{-1}$, where $J_{AM}$ designates a scalar coupling constant for coupling between spin A and spin M.

9. In a method which includes the steps of exciting a multiple quantum coherence in an NMR pulse experiment, said exciting step including the steps of subjecting a nuclear spin system to a magnetic field of high field strength and irradiating said nuclear spin system, while subjected to said magnetic field of high field strength, with a first sequence of RF pulses which includes a basic sequence having a first $\pi/2$-pulse, a first $\pi$-pulse generated after a defocusing time interval $\tau$ following the first $\pi/2$-pulse, and a second $\pi/2$-pulse generated after another time interval $\tau$ following the first $\pi$-pulse, said method further including the step of reconverting said excited multiple quantum coherence into a transverse magnetization for inducing a free induction decay, said reconverting step including the step of irradiating said nuclear spin system with a second sequence of RF pulses; the improvement comprising wherein said step of irradiating with said first sequence of RF pulses includes the steps of generating each of the three RF pulses of said basic sequence as a chirp pulse having a duration $t_p$ by sweeping the frequency of the exciting RF field in a monotonic fashion with respect to time during said duration $t_p$ between a lower limit frequency $\omega_{RFmin}$ and an upper limit frequency $\omega_{RFmax}$ and then generating, after an evolution interval $t_1$, an additional sequence which is an exact time reversed version of said basic sequence.

10. The method according to claim 9, including the step of selecting said evolution time $t_1$ so that $t_1 \approx 0$.

11. The method according to claim 10, including the step of generating immediately after said basic sequence a fourth chirp pulse having an amplitude which is about 3.3 times the amplitude of said first $\pi/2$-pulse in said basic sequence.

12. The method according to claim 9, wherein said step of irradiating with said second sequence of RF pulses includes the step of generating as two of the pulses of said second sequence of RF pulses a chirp $\pi/2$-pulse followed by a chirp $\pi$-pulse having half the duration and between 2 and 4 times the amplitude of the chirp $\pi/2$-pulse of said second sequence.

13. In a method for exciting, by means of a first sequence of RF pulses, at least one of a multiple quantum coherence and a double quantum coherence in an NMR pulse experiment by irradiating a nuclear spin system, subjected to a magnetic field, with the first pulse sequence which includes a first $\pi/2$-pulse, a first $\pi$-pulse generated after a defocusing time interval $\tau$ following the first $\pi/2$-pulse, and a second $\pi/2$-pulse generated after another time interval $\tau$ following the first $\pi$-pulse, and for reconverting, by irradiating the nuclear spin system with a second sequence of RF-pulses, the excited multiple quantum coherence into a transverse magnetization for inducing a free induction decay, the improvement comprising wherein the three RF pulses of the first pulse sequence are chirp pulses each having a duration $t_p$ during which the frequency of the exciting RF field is swept in a monotonic fashion with respect to time between a lower frequency $\omega_{RFmin}$ and an upper frequency $\omega_{RFmax}$ and the second sequence of RF pulses includes a fourth chirp pulse with a duration $t_p/2$ and an amplitude between 2 and 4 times the amplitude of the first $\pi/2$-pulse.

14. The method of claim 13, applied to heteronuclear correlation spectroscopy.

15. The method of claim 13, applied to at least one of NMR-imaging and NMR-in-vivo-spectroscopy.

16. In a method for exciting, by means of a first sequence of RF-pulses, at least one of a multiple quantum coherence and a double quantum coherence in an NMR pulse experiment by irradiating a nuclear spin system, subjected to a magnetic field of high field strength, with the first pulse sequence which includes a first $\pi/2$-pulse, a first $\pi$-pulse generated after a time interval $\tau$ following the first $\pi/2$-pulse, and a second $\pi/2$-pulse generated after another time interval $\tau$ following the first $\pi$-pulse, and for reconverting, by irradiating the nuclear spin system with a second sequence of RF-pulses, the excited multiple quantum coherence into a transverse magnetization for inducing a spin echo, the improvement wherein the second sequence of RF pulses further includes, after a dephasing time interval $\tau_1$ following the spin echo, a chirp refocusing $\pi$-pulse having a duration $t_p/2$ during which the frequency of the RF field is monotonically swept with respect to time between a lower frequency $\omega_{RFmin}$ and an upper frequency $\omega_{RFmax}$, and a subsequent chirp $\pi/2$-pulse of duration $t_p$.

17. The method of claim 16, wherein the second sequence of RF pulses further includes a subsequent chirp $\pi$-pulse of duration $\tau_T = t_p/2$ irradiated after a time delay $\tau_2$ following the subsequent chirp $\pi/2$-pulse to generate a spin echo for detection after a final delay $\tau_3$ following the subsequent chirp $\pi$-pulse.

18. The method of claim 17, wherein the time delay $\tau_2 \approx 0$ and the final delay $\tau_3 \approx \tau_\pi$.

19. The method of claim 17, wherein the time delay $\tau_2 \approx (2J_{AM})^{-1}$ and the final delay $\tau_3$ is chosen such that $\tau_2 + \tau_\pi + \tau_3 \approx J_{AM}^{-1}$, where $J_{AM}$ designates a scalar coupling constant for coupling between spin A and spin M.

20. The method of claim 17, wherein the time delay $\tau_2 \approx (4J_{AM})^{-1}$ and the final delay $\tau_3$ is chosen such that $\tau_2 + \tau_\pi + \tau_3 \approx (2J_{AM})^{-1}$, where $J_{AM}$ designates a scalar coupling constant for coupling between spin A and spin M.

21. In a method for exciting, by means of a first pulse sequence of RF pulses, at least one of a multiple and a double quantum coherence in an NMR pulse experiment by irradiating a nuclear spin system, subjected to a magnetic field of high field strength, with the first pulse sequence which includes a first $\pi/2$-pulse, a first $\pi$-pulse generated after a defocusing time interval $\tau$ following the first $\pi/2$-pulse, and a second $\pi/2$-pulse generated after another time interval $\tau$ following the first $\pi$-pulse, and for reconverting, by irradiating the nuclear spin system with a second sequence of RF pulses, the excited multiple quantum coherence into a transverse magnetization for inducing a free induction decay, the improvement wherein the three RF pulses of said first pulse sequence are chirp pulses each having a duration $t_p$ during which the frequency of the exciting RF field is swept in a monotonic fashion with respect to time between a lower frequency $\omega_{RFmin}$ and an upper frequency $\omega_{RFmax}$ and the first pulse sequence is followed, after an evolution interval $t_1$, by an additional pulse sequence which is a time reversed version of said first pulse sequence.

22. The method of claim 21, wherein $t_1 \approx 0$.

23. The method of claim 21, wherein the first pulse sequence is immediately followed by a fourth chirp pulse having an amplitude about 3.3 times the amplitude of the first $\pi/2$-pulse in the first pulse sequence.

24. The method of claim 21, wherein the additional sequence of RF pulses includes an additional chirp $\pi/2$-pulse followed by an additional chirp $\pi$-pulse having half the duration and between 2 and 4 times the amplitude of the additional chirp $\pi/2$-pulse.

* * * * *

UNITED STATES PATENT AND TRADEMARK OFFICE
CERTIFICATE OF CORRECTION

PATENT NO. : 5 327 086
DATED : July 5, 1994
INVENTOR(S) : Geoffrey Bodenhausen, et al It is certified that error appears in the above-indentified patent and that said Letters Patent is hereby corrected as shown below:

Column 16, line 37; change "furation" to ---duration---.
Column 18, line 18; change "duration $\tau_\tau=t_p/2$" to ---duration $\tau_\pi=t_p/2$---.

Signed and Sealed this

Fifteenth Day of November, 1994

Attest:

BRUCE LEHMAN

Attesting Officer     Commissioner of Patents and Trademarks